(12) United States Patent
DeLaCruz et al.

(10) Patent No.: US 11,823,906 B2
(45) Date of Patent: Nov. 21, 2023

(54) DIRECT-BONDED NATIVE INTERCONNECTS AND ACTIVE BASE DIE

(71) Applicant: Adeia Semiconductor Inc., San Jose, CA (US)

(72) Inventors: Javier A. DeLaCruz, San Jose, CA (US); Steven L. Teig, Menlo Park, CA (US); Shaowu Huang, Sunnyvale, CA (US); William C. Plants, Campbell, CA (US); David Edward Fisch, Pleasanton, CA (US)

(73) Assignee: Xcelsis Corporation, San Jose, CA (US)

( * ) Notice: Subject to any disclaimer, the term of this patent is extended or adjusted under 35 U.S.C. 154(b) by 0 days.

(21) Appl. No.: 17/675,396

(22) Filed: Feb. 18, 2022

(65) Prior Publication Data

US 2022/0238339 A1 Jul. 28, 2022

Related U.S. Application Data

(63) Continuation of application No. 16/944,823, filed on Jul. 31, 2020, now Pat. No. 11,289,333, which is a
(Continued)

(51) Int. Cl.
*H01L 21/20* (2006.01)
*H01L 25/065* (2023.01)
(Continued)

(52) U.S. Cl.
CPC ...... *H01L 21/2007* (2013.01); *H01L 21/4875* (2013.01); *H01L 21/743* (2013.01);
(Continued)

(58) Field of Classification Search
CPC ............ H01L 21/2007; H01L 21/4875; H01L 21/743; H01L 21/82; H01L 24/02;
(Continued)

(56) References Cited

U.S. PATENT DOCUMENTS

| 5,016,138 A | 5/1991 | Woodman |
| 5,376,825 A | 12/1994 | Tukamoto et al. |

(Continued)

FOREIGN PATENT DOCUMENTS

| CN | 1175805 A | 3/1998 |
| CN | 101521194 A | 9/2009 |

(Continued)

OTHER PUBLICATIONS

Author Unknown, "Fact Sheet: New Intel Architectures and Technologies Target Expanded Market Opportunities," Dec. 12, 2018, 9 pages, Intel Corporation,Santa Clara, California.
(Continued)

*Primary Examiner* — Brook Kebede
(74) *Attorney, Agent, or Firm* — Haley Guiliano LLP

(57) ABSTRACT

Direct-bonded native interconnects and active base dies are provided. In a microelectronic architecture, active dies or chiplets connect to an active base die via their core-level conductors. These native interconnects provide short data paths, which forgo the overhead of standard interfaces. The system saves redistribution routing as the native interconnects couple in place. The base die may contain custom logic, allowing the attached dies to provide stock functions. The architecture can connect diverse interconnect types and chiplets from various process nodes, operating at different voltages. The base die may have state elements for drive. Functional blocks aboard the base die receive native signals from diverse chiplets, and communicate with all attached chiplets. The chiplets may share processing and memory resources of the base die. Routing blockages are minimal, improving signal quality and timing. The system can operate at dual or quad data rates. The architecture facilitates ASIC, ASSP, and FPGA ICs and neural networks, reducing footprint and power requirements.

20 Claims, 15 Drawing Sheets

Related U.S. Application Data continuation of application No. 16/730,220, filed on Dec. 30, 2019, now Pat. No. 10,832,912, which is a continuation of application No. 15/725,030, filed on Oct. 4, 2017, now Pat. No. 10,522,352.

(60) Provisional application No. 62/405,833, filed on Oct. 7, 2016.

(51) Int. Cl.
| | |
|---|---|
| *H01L 23/00* | (2006.01) |
| *H01L 21/48* | (2006.01) |
| *H01L 21/74* | (2006.01) |
| *H01L 21/82* | (2006.01) |
| *H01L 23/538* | (2006.01) |
| *H01L 25/18* | (2023.01) |

(52) U.S. Cl.
CPC .............. *H01L 21/82* (2013.01); *H01L 24/02* (2013.01); *H01L 25/0652* (2013.01); *H01L 23/538* (2013.01); *H01L 25/18* (2013.01); *H01L 2924/15311* (2013.01)

(58) Field of Classification Search
CPC ......... H01L 24/80; H01L 24/81; H01L 24/82; H01L 24/85; H01L 25/0652
See application file for complete search history.

(56) References Cited

U.S. PATENT DOCUMENTS

| | | |
|---|---|---|
| 5,579,207 A | 11/1996 | Hayden et al. |
| 5,621,863 A | 4/1997 | Boulet et al. |
| 5,673,478 A | 10/1997 | Beene et al. |
| 5,717,832 A | 2/1998 | Steimle et al. |
| 5,740,326 A | 4/1998 | Boulet et al. |
| 5,793,115 A | 8/1998 | Zavracky |
| 5,909,587 A | 6/1999 | Tran |
| 6,320,255 B1 | 11/2001 | Terrill |
| 6,421,654 B1 | 7/2002 | Gordon |
| 6,707,124 B2 | 3/2004 | Wachtler et al. |
| 6,844,624 B1 | 1/2005 | Kiritani |
| 6,891,447 B2 | 5/2005 | Song |
| 6,909,194 B2 | 6/2005 | Farnworth et al. |
| 6,917,219 B2 | 7/2005 | New |
| 6,962,835 B2 | 11/2005 | Tong et al. |
| 7,046,522 B2 | 5/2006 | Sung et al. |
| 7,099,215 B1 | 8/2006 | Rotenberg et al. |
| 7,124,250 B2 | 10/2006 | Kyung |
| 7,202,566 B2 | 4/2007 | Liaw |
| 7,485,968 B2 | 2/2009 | Enquist et al. |
| 7,638,869 B2 | 12/2009 | Irsigler et al. |
| 7,692,946 B2 | 4/2010 | Taufique et al. |
| 7,863,918 B2 | 1/2011 | Jenkins |
| 7,977,962 B2 | 7/2011 | Hargan et al. |
| 8,032,711 B2 | 10/2011 | Black et al. |
| 8,042,082 B2 | 10/2011 | Solomon |
| 8,059,443 B2 | 11/2011 | McLaren et al. |
| 8,110,899 B2 | 2/2012 | Reed et al. |
| 8,148,814 B2 | 4/2012 | Furuta et al. |
| 8,223,523 B2 | 7/2012 | Jin et al. |
| 8,223,524 B2 | 7/2012 | Chung |
| 8,228,684 B2 | 7/2012 | Losavio et al. |
| 8,233,303 B2 | 7/2012 | Best et al. |
| 8,432,467 B2 | 4/2013 | Jaworski et al. |
| 8,441,831 B2 | 5/2013 | Ku et al. |
| 8,516,409 B2 | 8/2013 | Coteus et al. |
| 8,546,955 B1 | 10/2013 | Wu |
| 8,547,769 B2 | 10/2013 | Saraswat et al. |
| 8,552,569 B2 | 10/2013 | Lee |
| 8,704,384 B2 | 4/2014 | Wu et al. |
| 8,736,068 B2 | 5/2014 | Bartley et al. |
| 8,797,818 B2 | 8/2014 | Jeddeloh |
| 8,816,506 B2 | 8/2014 | Kawashita et al. |
| 8,860,199 B2 | 10/2014 | Black et al. |
| 8,885,380 B2 | 11/2014 | Kang et al. |
| 8,901,749 B2 | 12/2014 | Kim et al. |
| 8,907,439 B1 | 12/2014 | Kay et al. |
| 8,930,647 B1 | 1/2015 | Smith |
| 8,947,931 B1 | 2/2015 | D'Abreu |
| 8,987,066 B2 | 3/2015 | Grobelny et al. |
| 9,030,253 B1 | 5/2015 | Ngai |
| 9,067,272 B2 | 6/2015 | Sutanto |
| 9,076,700 B2 | 7/2015 | Kawashita et al. |
| 9,076,770 B2 | 7/2015 | Foster, Sr. et al. |
| 9,142,262 B2 | 9/2015 | Ware |
| 9,190,392 B1 | 11/2015 | Shinde et al. |
| 9,230,940 B2 | 1/2016 | Goodnow et al. |
| 9,300,298 B2 | 3/2016 | Cordero |
| 9,318,418 B2 | 4/2016 | Kawashita et al. |
| 9,418,964 B2 | 8/2016 | Chang et al. |
| 9,432,298 B1 | 8/2016 | Smith |
| 9,478,496 B1 | 10/2016 | Lin |
| 9,484,326 B2 | 11/2016 | Keeth et al. |
| 9,497,854 B2 | 11/2016 | Giuliano |
| 9,501,603 B2 | 11/2016 | Barowski et al. |
| 9,508,607 B2 | 11/2016 | Chua-Eoan |
| 9,640,233 B2 | 5/2017 | Sohn |
| 9,645,603 B1 | 5/2017 | Chall et al. |
| 9,647,187 B1 | 5/2017 | Yap et al. |
| 9,691,739 B2 | 6/2017 | Kawashita et al. |
| 9,726,691 B2 | 8/2017 | Garibay |
| 9,746,517 B2 | 8/2017 | Whetsel |
| 9,747,959 B2 | 8/2017 | Seo |
| 9,825,843 B2 | 11/2017 | Thottethodi et al. |
| 9,871,014 B2 | 1/2018 | Haba |
| 9,915,978 B2 | 3/2018 | Dabby et al. |
| 9,934,832 B2 | 4/2018 | Shibata et al. |
| 10,121,743 B2 | 11/2018 | Kamal |
| 10,180,692 B2 | 1/2019 | Kouchi |
| 10,241,150 B2 | 3/2019 | Woo et al. |
| 10,255,969 B2 | 4/2019 | Eom et al. |
| 10,262,911 B1 | 4/2019 | Gong |
| 10,269,586 B2 | 4/2019 | Chou et al. |
| 10,289,604 B2 | 5/2019 | Sankaralingam et al. |
| 10,373,657 B2 | 8/2019 | Kondo et al. |
| 10,446,207 B2 | 10/2019 | Kim et al. |
| 10,446,601 B2 | 10/2019 | Otake et al. |
| 10,522,352 B2 | 12/2019 | Delacruz et al. |
| 10,580,735 B2 | 3/2020 | Mohammed et al. |
| 10,580,757 B2 | 3/2020 | Nequist et al. |
| 10,580,817 B2 | 3/2020 | Otake et al. |
| 10,586,786 B2 | 3/2020 | DeLaCruz et al. |
| 10,593,667 B2 | 3/2020 | DeLaCruz et al. |
| 10,600,691 B2 | 3/2020 | DeLaCruz et al. |
| 10,600,735 B2 | 3/2020 | DeLaCruz et al. |
| 10,600,780 B2 | 3/2020 | DeLaCruz et al. |
| 10,607,136 B2 | 3/2020 | Teig et al. |
| 10,672,663 B2 | 6/2020 | DeLaCruz et al. |
| 10,672,743 B2 | 6/2020 | Teig et al. |
| 10,672,744 B2 | 6/2020 | Teig et al. |
| 10,672,745 B2 | 6/2020 | Teig et al. |
| 10,719,762 B2 | 7/2020 | Teig et al. |
| 10,762,420 B2 | 9/2020 | Teig et al. |
| 10,832,912 B2 | 11/2020 | Delacruz et al. |
| 2001/0017418 A1 | 8/2001 | Noguchi et al. |
| 2002/0008309 A1* | 1/2002 | Akiyama ............ H01L 25/0657 257/E25.011 |
| 2003/0102495 A1 | 6/2003 | Huppenthal et al. |
| 2005/0116331 A1 | 6/2005 | Tsunozaki |
| 2005/0127490 A1 | 6/2005 | Black et al. |
| 2006/0036559 A1 | 2/2006 | Nugent |
| 2006/0087013 A1 | 4/2006 | Hsieh |
| 2007/0220207 A1 | 9/2007 | Black et al. |
| 2008/0017971 A1 | 1/2008 | Hollis |
| 2008/0061373 A1 | 3/2008 | Park |
| 2009/0070727 A1 | 3/2009 | Solomon |
| 2010/0140750 A1 | 6/2010 | Toms |
| 2010/0261159 A1 | 10/2010 | Hess et al. |
| 2010/0283085 A1 | 11/2010 | Bemanian et al. |
| 2011/0026293 A1 | 2/2011 | Riho |
| 2011/0084365 A1 | 4/2011 | Law et al. |
| 2011/0131391 A1 | 6/2011 | Barowski et al. |

(56) References Cited

U.S. PATENT DOCUMENTS

| | | |
|---|---|---|
| 2011/0147949 A1 | 6/2011 | Karp et al. |
| 2012/0092062 A1 | 4/2012 | Lee et al. |
| 2012/0119357 A1 | 5/2012 | Byeon et al. |
| 2012/0136913 A1 | 5/2012 | Duong et al. |
| 2012/0170345 A1 | 7/2012 | Choi et al. |
| 2012/0201068 A1 | 8/2012 | Ware |
| 2012/0242346 A1 | 9/2012 | Wang |
| 2012/0262196 A1 | 10/2012 | Yokou |
| 2012/0286431 A1 | 11/2012 | Foster, Sr. et al. |
| 2012/0313263 A1 | 12/2012 | Barth |
| 2013/0021866 A1 | 1/2013 | Lee |
| 2013/0032950 A1 | 2/2013 | Ware et al. |
| 2013/0051116 A1 | 2/2013 | En et al. |
| 2013/0144542 A1 | 6/2013 | Ernst |
| 2013/0187292 A1 | 7/2013 | Semmelmeyer |
| 2013/0207268 A1 | 8/2013 | Chapelon |
| 2013/0242500 A1 | 9/2013 | Lin et al. |
| 2013/0275823 A1 | 10/2013 | Cordero et al. |
| 2013/0321074 A1 | 12/2013 | Ko et al. |
| 2014/0022002 A1 | 1/2014 | Chua-Eoan et al. |
| 2014/0285253 A1 | 9/2014 | Jeon et al. |
| 2014/0323046 A1 | 10/2014 | Asai |
| 2014/0369148 A1 | 12/2014 | Matsui et al. |
| 2015/0061097 A1 | 3/2015 | Pham et al. |
| 2015/0199997 A1 | 7/2015 | Ito et al. |
| 2015/0228584 A1 | 8/2015 | Huang et al. |
| 2015/0262902 A1* | 9/2015 | Shen .................... H01L 23/147 438/107 |
| 2016/0093601 A1 | 3/2016 | Ding et al. |
| 2016/0111386 A1 | 4/2016 | England et al. |
| 2016/0218046 A1 | 7/2016 | Or-Bach et al. |
| 2016/0225431 A1 | 8/2016 | Best et al. |
| 2016/0233134 A1 | 8/2016 | Lim et al. |
| 2016/0329312 A1 | 11/2016 | O'Mullan et al. |
| 2016/0379115 A1 | 12/2016 | Burger |
| 2017/0092615 A1 | 3/2017 | Oyamada |
| 2017/0092616 A1 | 3/2017 | Su et al. |
| 2017/0148737 A1 | 5/2017 | Fasano et al. |
| 2017/0194309 A1 | 7/2017 | Evans et al. |
| 2017/0213787 A1 | 7/2017 | Alfano et al. |
| 2017/0227605 A1 | 8/2017 | Kim et al. |
| 2017/0278213 A1 | 9/2017 | Eckert |
| 2017/0278789 A1 | 9/2017 | Chuang |
| 2017/0285584 A1 | 10/2017 | Nakagawa et al. |
| 2017/0301625 A1 | 10/2017 | Mahajan et al. |
| 2018/0017614 A1 | 1/2018 | Leedy |
| 2018/0068218 A1 | 3/2018 | Yoo et al. |
| 2018/0286800 A1 | 10/2018 | Kamal et al. |
| 2018/0330992 A1 | 11/2018 | Delacruz et al. |
| 2018/0330993 A1 | 11/2018 | Delacruz et al. |
| 2018/0331037 A1 | 11/2018 | Mohammed et al. |
| 2018/0331038 A1 | 11/2018 | Delacruz et al. |
| 2018/0331072 A1 | 11/2018 | Nequist et al. |
| 2018/0331094 A1 | 11/2018 | Delacruz et al. |
| 2018/0331095 A1 | 11/2018 | Delacruz et al. |
| 2018/0350775 A1 | 12/2018 | DeLaCruz |
| 2018/0373975 A1 | 12/2018 | Yu et al. |
| 2018/0374788 A1 | 12/2018 | Nakagawa et al. |
| 2019/0006322 A1 | 1/2019 | Park |
| 2019/0042377 A1 | 2/2019 | Teig et al. |
| 2019/0042912 A1 | 2/2019 | Teig et al. |
| 2019/0042929 A1 | 2/2019 | Teig et al. |
| 2019/0043832 A1 | 2/2019 | Teig et al. |
| 2019/0051641 A1 | 2/2019 | Lee et al. |
| 2019/0109057 A1 | 4/2019 | Hargan et al. |
| 2019/0123022 A1 | 4/2019 | Teig et al. |
| 2019/0123023 A1 | 4/2019 | Teig et al. |
| 2019/0123024 A1 | 4/2019 | Teig et al. |
| 2019/0156215 A1 | 5/2019 | Matveev et al. |
| 2019/0180183 A1 | 6/2019 | Diamant et al. |
| 2019/0214991 A1 | 7/2019 | Ngai |
| 2019/0244933 A1 | 8/2019 | Or-Bach |
| 2020/0013699 A1 | 1/2020 | Liu |
| 2020/0143866 A1 | 5/2020 | Biswas et al. |
| 2020/0194052 A1 | 6/2020 | Shaeffer et al. |
| 2020/0203318 A1 | 6/2020 | Nequist et al. |
| 2020/0219771 A1 | 7/2020 | DeLaCruz et al. |
| 2020/0227389 A1 | 7/2020 | Teig et al. |
| 2020/0273798 A1 | 8/2020 | Mohammed et al. |
| 2020/0293872 A1 | 9/2020 | Teig et al. |
| 2020/0294858 A1 | 9/2020 | DeLaCruz et al. |
| 2020/0372345 A1 | 11/2020 | Li |

FOREIGN PATENT DOCUMENTS

| | | |
|---|---|---|
| CN | 102598255 A | 7/2012 |
| CN | 102856306 A | 1/2013 |
| CN | 103219325 B | 4/2016 |
| CN | 105529279 A | 4/2016 |
| CN | 106611756 A | 5/2017 |
| EP | 2466632 A2 | 6/2012 |
| EP | 3698401 A1 | 8/2020 |
| EP | 3698402 A1 | 8/2020 |
| KR | 20150137970 A | 12/2015 |
| WO | 2017138121 A1 | 8/2017 |
| WO | 2019079625 A1 | 4/2019 |
| WO | 2019079631 A1 | 4/2019 |

OTHER PUBLICATIONS

Author Unknown, "Vector Supercomputer SX Series: SX—Aurora TSUBASA," Oct. 2017, 2 pages, NEC Corporation.

Bansal, Samta, "3D-IC is Now Real: Wide-IO is Driving 3D-IC TSV," Cadence Flash Memory Summit, Aug. 2012, 14 pages, Cadence Design Systems, Inc.

Black, Bryan, "Die Stacking is Happening!," Dec. 9, 2013, 53 pages, Advanced Micro Devices, Inc., Santa Clara, California.

Black, Bryan, et al., "3D Processing Technology and its Impact on iA32 Microprocessors," Proceedings of 2004 IEEE International Conference on Computer Design: VLSI in Computers and Processors, Oct. 11-13, 2004, 3 pages, IEEE, San Jose, California.

Black, Bryan, et al., "Die Stacking (3D) Microarchitecture," Proceedings of the 39th Annual IEEE/ACM International Symposium on Microarchitecture, Dec. 9-13, 2006, 11 pages, IEEE, Orlando, Florida.

Hajkazemi, Mohammad Hossein, et al., "Wide I/O or LPDDR? Exploration and Analysis of Performance, Power and Temperature Trade-offs of Emerging DRAM Technologies in Embedded MPSoCs," Proceedings of 33rd IEEE International Conference on ComputerDesign (ICCD), Oct. 18-21, 2015, 8 pages, IEEE, New York City, New York.

Kim, Jung-Sik, et al., "A 1.2 V 12.8 GB/s 2 GB Mobile Wide-I/O DRAM With 4x128 I/Os Using TSV Based Stacking," IEEE Journal of Solid-State Circuits, Jan. 2012, 10 pages, vol. 47, No. 1, IEEE.

Loh, Gabriel H., et al., "Processor Design in 3D Die-Stacking Technologies," IEEE Micro, May/Jun. 2007, 18 pages, vol. 27, Issue 3, IEEE Computer Society.

Nakamoto, Mark, et al., "Simulation Methodology and Flow Integration for 3D IC Stress Management," 2010 IEEE Custom Integrated Circuits Conference, Sep. 19-22, 2010, 4 pages, IEEE, San Jose, CA, USA.

Tran, Kevin, et al., "Start Your HBM/2.5D Design Today," High-Bandwidth Memory White Paper, Mar. 29, 2016, 6 pages, Amkor Technology, Inc., San Jose, CA, USA.

Wu, Xiaoxia, et al., "Electrical Characterization for Intertier Connections and Timing Analysis for 3-D ICs," IEEE Transactions on Very Large Scale Integration (VLSI) Systems, Dec. 6, 2010, 5 pages, IEEE.

Invitation to Pay Additional Fees for Commonly Owned International Patent Application PCT/US2018/056559, dated Feb. 7, 2019, 15 pages, International Searching Authority (EPO).

Invitation to Pay Additional Fees for Commonly Owned International Patent Application PCT/US2018/056565, dated Feb. 12, 2019, 13 pages, International Searching Authority (EPO).

International Search Report and Written Opinion of Commonly Owned International Patent Application PCT/US2018/056565, dated Apr. 2, 2019, 17 pages, International Searching Authority (European Patent Office).

(56) References Cited

OTHER PUBLICATIONS

Non-Published Commonly Owned Related U.S. Appl. No. 16/806,854, filed Mar. 2, 2020, 75 pages, Xcelsis Corporation.
Non-Published Commonly Owned Related U.S. Appl. No. 16/889,698, filed Jun. 1, 2020, 74 pages, Xcelsis Corporation.
Non-Published Commonly Owned Related U.S. Appl. No. 16/891,027, filed Jun. 2, 2020, 47 ages, Xcelsis Corporation.
International Search Report and Written Opinion of Commonly Owned International Patent Application PCT/US2018/056559, dated Mar. 29, 2019, 17 pages, International Searching Authority (European Patent Office).
Non-Published Commonly Owned Related U.S. Appl. No. 16/827,467, filed Mar. 23, 2020, 74 pages, Xcelsis Corporation.
Nair, Vinod and Hinton, Geoffrey E., "Rectified linear units improve restricted Boltzmann machines," ICML, pp. 807-814, 2010.
He, Kaiming, Zhang, Xiangyu, Ren, Shaoqing, and Sun, Jian, "Delving deep into rectifiers: Surpassing human-level performance on imagenet classification," arXiv preprint arXiv: 1502.01852, 2015, pp. 1026-1034.
Non-Published Commonly Owned U.S. Appl. No. 16/806,934, filed Mar. 2, 2020, 74 pages, Xcelsis Corporation.
"Sony IMX260 12 MP", "Sony IMX260 12 MP," TechInsights, https://www.techinsights.com/products/ipr-1603-802 (Accessed Feb. 10, 2023).
"Sony IX260 in Samsung Galaxy S7: Stacked or Not?", "Sony IX260 in Samsung Galaxy S7: Stacked or Not?," Image Sensors World, http://image-sensors-world.blogspot.com/2016/03/sony-imx260-in-samsung-galaxy-s7.html (2016).
Kagawa, Y., et al., "Novel Stacked CMOS Image Sensor with Advanced Cu2Cu Hybrid Bonding," 2016 IEEE, pp. 8.4.1-8.4.4.
Garrou, Phil, "IFTLE 303 Sony Introduces Ziptronix DBI Technology in Samsung Galaxy S7", http://image-sensorsworld.blogspot.com/2016/03/sony-imx260-in-samsung-galaxy-s7.html (2016).

* cited by examiner

DIRECT-BONDED NATIVE INTERCONNECTS AND ACTIVE BASE DIE

CROSS-REFERENCE TO RELATED APPLICATIONS

This patent application is a continuation of U.S. patent application Ser. No. 16/944,823 filed Jul. 31, 2020, which is the continuation of Ser. No. 16/730,220 filed Dec. 30, 2019, which is the continuation of U.S. patent application Ser. No. 15/725,030 filed Oct. 4, 2017, which claims the benefit of priority to U.S. Provisional Patent Application No. 62/405,833 filed Oct. 7, 2016, the disclosures of which are incorporated by reference herein in their entireties.

BACKGROUND

In microelectronic systems, electronic circuits are fabricated on a wafer of semiconductor material, such as silicon. The wafer with electronic circuits may be bonded to one or more other wafers, bonded to individual dies, or itself diced into numerous dies, each die containing a copy of the circuit. Each die that has a functional integrated circuit is known as a microchip, or "chip." When specific functions from a library of functions are assigned to individual chips, or when a large monolithic chip is emulated by a collection of smaller chips, these smaller chips, or chips with specific or proprietary functions, may be referred to as "chiplets." As used herein, chiplet most often means a complete subsystem IP core (intellectual property core), a reusable unit of logic, on a single die. A library of chiplets is available to provide routine or well-established IP-block functions.

Conventionally, microchips and chiplets need standard interfaces to communicate and interact with each other and with larger microelectronic layouts that make up microelectronic devices. The use of such standard interfaces is expected in the industry, and taken for granted. It is assumed in the industry that every block of logic that needs input and output (I/O) will work through a standard interface including at least some I/O protocol. A standard interface may be formally defined as:

"a point of interconnection between two systems or parts of a system, e.g., that between a processor and a peripheral, at which all the physical, electrical, and logical parameters are in accordance with predetermined values and are collectively used in other instances. An interface may be classed as standard on the basis of manufacturer, industry, or international usage. The I/O channels of a processor may be classed as standard interfaces because they are common to all processors of that type, or common to more than one type of peripheral—but they may be specific to a manufacturer. Some interfaces are de facto industry standards and can be used to connect devices from different vendors. Other interfaces are standardized by agreement within trade associations or international committees or consortiums" (A Dictionary of Computing 2004, originally published by Oxford University Press 2004).

Standard interfaces and I/O protocols provide well-characterized outputs that have drivers sufficiently large to power various output loads and to provide other benefits, such as voltage leveling and buffered inputs with electrostatic discharge (ESD) protection. The tradeoff for these benefits is that the native signals produced by the specific logic, or "core IP," of a given microchip have to be adapted, modified, and usually routed, to be of suitable compatibility for a standard interface. The standard interfaces, in turn, enable multiple independent chips to "talk to" each other in a standardized manner according to standardized protocols, as the interfaces have standard pinout geometry, contrived serialization, standard voltages, standard timing, and so forth, to enable common compatibility. But chiplets and resulting 3D stacked IC structures are often larger, more complicated, costlier, produce more heat, and are more power-hungry than they need to be in order to support their onboard standard interfaces and I/O protocols.

SUMMARY

Direct-bonded native interconnects and active base dies are provided. The native interconnects are metal-to-metal bonds formed directly between native conductors of a die and conductors of a second die, thereby forgoing the need for the complexity and overhead of standard interfaces. A native conductor of a die is an electrical conductor that has electrical access to the raw or native signal of the die, operational at the level of the core functional logic of the particular die, without significant modification of the signal for purposes of interfacing with other dies.

In a microelectronic architecture, active dies or chiplets connect to an active base die via their core-level conductors. These native interconnects provide short data paths, which forgo the overhead of standard interfaces. The system can save redistribution routing as the native interconnects couple in place. The active base die may contain custom logic, allowing the attached dies to provide stock functions.

An active base die can adapt multiple interconnect types, and can accommodate chiplets from various process nodes and different operating voltages. The active base die may utilize its own state elements for signal drive, or may use state elements aboard the attached chiplets over cross-die boundaries for drive. The active base die receives native core-side signals from multiple diverse chiplets, and enables two-way communication between functional elements of the active base die and the attached chiplets. The active base die can dramatically reduce size and area footprint, and can lower power requirements, especially for large hard chiplets. The active base die can integrate repeater cells for longer routes when needed, and exploit data transfer schemes to boost signal quality, improve timing, and provide a native high speed interface. The chiplets may share processing and memory resources of the base die. Routing blockages are minimal as certain circuit elements on the chiplet can be oriented and/or aligned with circuit elements on the base die, improving signal quality and timing. The system can optionally operate at dual data rate (DDR) or quad data rate (QDR). The architecture facilitates ASIC, ASSP, and FPGA integrated circuits and large neural networks, while reducing footprint and power requirements.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

Figure 1:
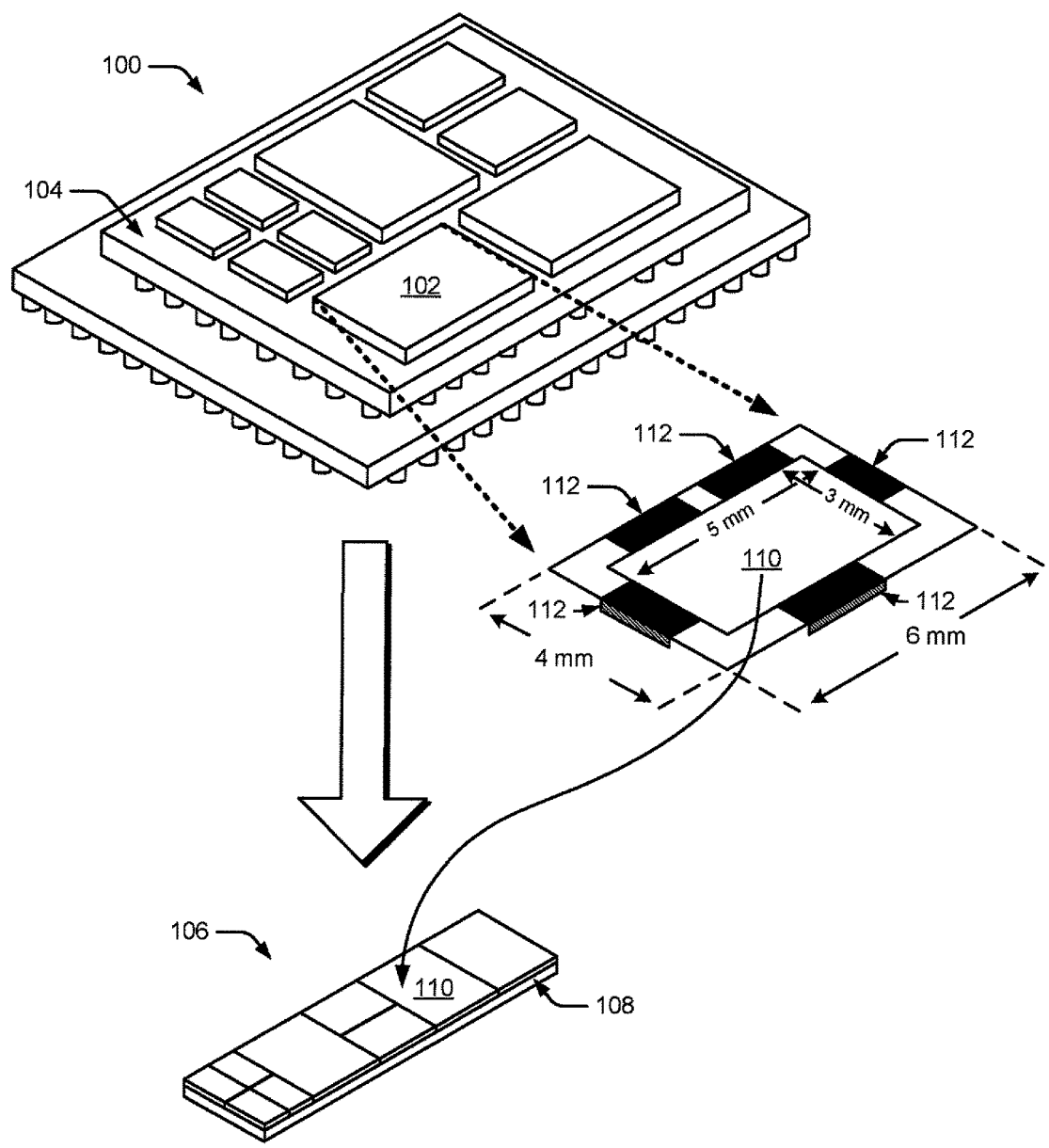
FIG. 1 is a diagram of an example of conventional standard interfaces on each of the four sides of a conventional microchip.

This disclosure describes example direct-bonded native interconnects and active base dies. An example microelectronic device has dies with core-side conductors direct-bonded to one or more other dies, thereby providing "native interconnects," which in an implementation can provide the only interface between the dies. The native interconnects can enable electronic circuits to span across different dies and across the die boundaries between multiple different dies, but with no standard interfaces and no input/output protocols at the cross-die boundaries traversed by the direct-bonded connections to the native core-side conductors.

"Standard interface," as used herein, accords with the dictionary definition as given in the Background section above, and more briefly means "additional hardware, software, routing, logic, connections, or surface area added to the core logic real estate or functionality of a die in order to meet an industry or consortium specification for interfacing, connecting, or communicating with other components or signals outside the die." "Direct-bonding" as used herein means direct-contact metal-to-metal bonding, oxide bonding, or fusion bonding between two metals, such as copper to copper (Cu—Cu) metallic bonding between two copper conductors in direct contact, with at least partial crystal lattice cohesion. Such direct-bonding may be provided by a hybrid bonding technique such as DBI® (direct bond interconnect) technology to be described below, and other metal bonding techniques (Invensas Bonding Technologies, Inc., an Xperi Corporation company, San Jose, Calif.). "Core" and "core-side" as used herein mean at the location, signal, and/or level present at the functional logic of a particular die, as opposed to at the location, signal, and/or level of an added standard interface defined by a consortium. Thus, a signal is raw or "native" if it is operational at the core functional logic level of a particular die, without certain modifications, such as additional serialization, added ESD protection except as inherently provided by the particular circuit; has an unserialized data path, can be coupled across dies by a simple latch, flop, or wire, has no imposed input/output (I/O) protocols, and so forth. A native signal, however, can undergo level shifting, or voltage regulation for purposes of adaptation between dies of heterogeneous foundry origin, and still be a native signal, as used herein. "Active" as used herein (active base die) accords with the usual meaning of active in the semiconductor arts, as opposed to "passive." Active components include transistor logic and amplifying components, such as the transistors. Passive components, on the other hand, do not introduce net energy into a circuit, and do not use an original source of power, except for power derived from other circuits connected to the passive circuit. While the techniques set forth herein generally refer to active die, the techniques may also be applied to passive devices and enjoy the same or similar benefits.

A "native conductor" of a die is an electrical conductor that has electrical access to the raw or native signal of the die, as described above, the native signal being a signal that is operational at the level of the core functional logic of a particular die, without appreciable modification of the signal for purposes of interfacing with other dies.

The native interconnects for conducting such native signals from the core-side of a die can provide continuous circuits disposed through two or more cross-die boundaries without amplifying or modifying the native signals, except as desired to accommodate dies from different manufacturing processes. From a signal standpoint, the native signal of the IP core of one die is passed directly to other dies via the directly bonded native interconnects, with no modification of the native signal or negligible modification of the native signal, thereby forgoing standard interfacing and consortium-imposed input/output protocols.

Remarkably, such uninterrupted circuits that proceed across or span die boundaries with no interfacing and no input/output protocols can be accomplished using native interconnects fabricated between different dies from heterogeneous foundry nodes or dies with incompatible manufacturing. Hence, an example circuit may proceed across the die boundary between a first die manufactured at a first foundry node that is direct-bonded to a second die manufactured at a second foundry node, with no other interfacing, or with as little as latching or level shifting, for example, to equalize voltages between dies. In an implementation, the circuits disposed between multiple dies through direct-bonded native interconnects may proceed between an active base die and proprietary chiplet dies, or between dies (including an active base die) on each side of a wafer-to-wafer (W2 W) process that creates direct-bonds, wherein at least some of the W2 W direct bonding involves the native conductors of dies on at least one side of the W2 W bonds.

In an implementation, a microelectronic system utilizing semiconductor chiplets can reproduce various architectures, such as ASIC, ASSP, and FPGA, in a smaller, faster, and more power-efficient manner. A chiplet, as introduced above, is a complete subsystem IP core (intellectual property core), for example, a reusable unit of logic on a single die.

The native interconnects can be made during die-to-die or die-to-wafer direct-bonding that creates native interconnects between a first die, such as an active die or a chiplet, and a second die, which may be an active base die. The native interconnects can also be fabricated by direct-bonding during wafer-to-wafer (W2 W) processes, between an active base die, for example, on one wafer, and layers of other active dies on other wafers. One or more of the die may be implemented in a semiconductor material, though other materials, such as, for example, glass, oxide, or polymer may also be implemented as suitable for a given design.

FIG. 1 shows an example comparison between a conventional microelectronics package 100 with multiple conventional chiplets 102 on a conventional interposer 104, versus an example microelectronics package 106 rendered on an active base die 108, as described herein. The example microelectronics package 106 provides a much smaller physical package and a significant improvement over the conventional package 100. A conventional chiplet 102 contains, for example, a CPU core 110 surrounded by conventional standard interfaces 112. The smaller improved package 106 contains the same CPU core 110, for example, attached directly to the active base die 108 without the presence of the conventional standard interfaces 112. The smaller improved package 106 is not only smaller, but also more efficient, easier to manufacture, and has lower power requirements than its conventional counterpart package 100, and provides additional benefits besides.

In FIG. 1, conventional standard interfaces 112 may be located on each of the four sides of a conventional microchip or chiplet 102, such as the central processing unit (CPU) core 110. The standard interfaces 112 come at a cost. It is evident in FIG. 1 that the standard interfaces 112 increase the area footprint of the example CPU core significantly. If the CPU core 110 has 3×5 mm dimensions, the CPU core 110 as a chiplet 110 with standard interfaces 112 may have 4×6 mm dimensions. Sometimes the inclusion of the standard interfaces 112 effectively doubles the area footprint of a given chiplet. The standard interfaces 112 also draw significant extra power over the native logic of the CPU core 110 itself. For example, the line drivers that are required to be in the standard interfaces 112 must be able to drive a large number of unknown output loads that could potentially be connected, depending on unknown future uses. Since the standard interfaces 112 must be able to universally adapt to a large number of unknown output loads, the conventional standard interfaces 112 typically possess an "overkill" of driver capacity and other capabilities that must be powered, yet may be unnecessary for the actual utilization of the chip.

The standard interfaces 112 also require significant extra routing from the native interconnects of the core IP to the standard interfaces 112, in order for the native signal to get to the standard interfaces 112 in the first place. Thus, data paths are longer and inherently less reliable, and there is often congestion at the corner geometries of large chip layouts. To satisfy compatibility with the standard interface 112, the native signal is often buffered, processed, and adulterated by extra components, such as inverters, repeaters, drivers, state machines, timers, and voltage regulators, which are added to the die for the sake of the standard interfaces 112. Because the legacy pad size and line pitches of standard interfaces are relatively large, some conventional schemes add further complexity by multiplexing or serializing the highly parallelized native signals via SerDes blocks or other interfaces, just to be able to offboard the signal via a limited number of pins, given the conventional large pitch constraint between dies. Thus the standard interfaces 112 can be a cumbersome bottleneck for I/O itself, in addition to raising power requirements and demanding extra layout area.

Figure 2:
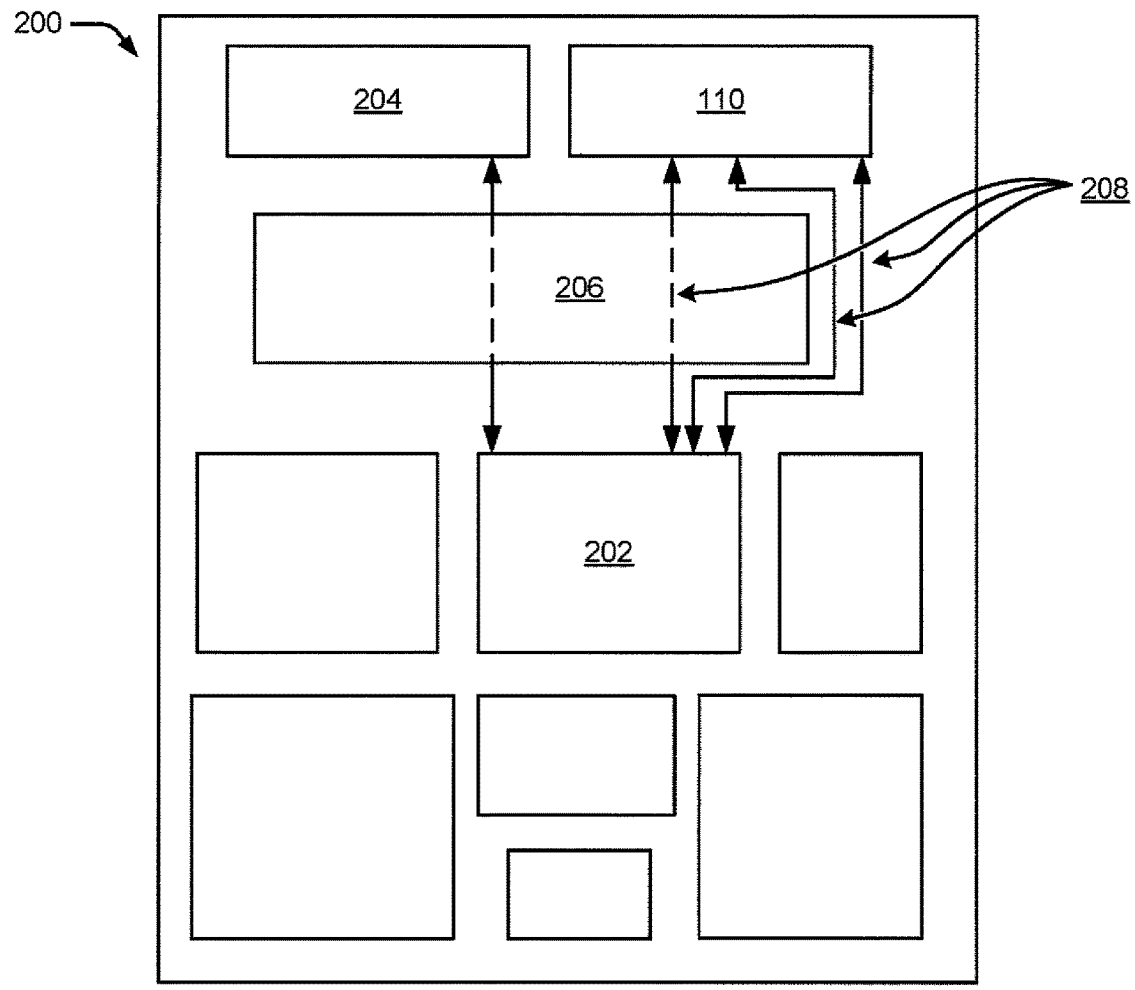
FIG. 2 is a diagram of a conventional monolithic integrated circuit layout with various functional blocks.
Figure 2:
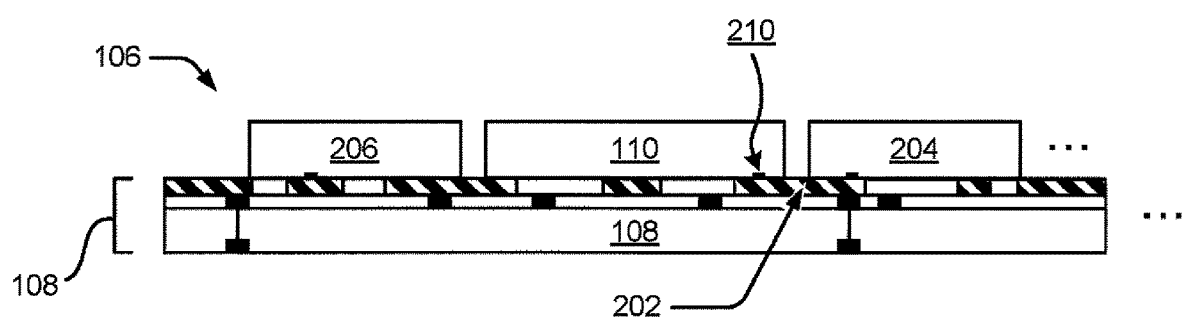

FIG. 2 shows a conventional monolithic integrated circuit layout 200 with various functional blocks 110 & 202 & 204 & 206 . . . n, versus the example microelectronics package 106 described herein in another part FIG. 2, with the same functional blocks 110 & 202 & 204 & 206 coupled to an active base die 108. A functional block, or just "block," can consist of an interface and an implementation. Example blocks include multipliers, arithmetic logic units (ALUs), instruction decoders, digital signal processors (DSPs), and so forth.

The functional block 202 has been incorporated into the active base die 108. In the two-dimensional (2D) floorplan of the conventional monolithic IC 200, it is evident that some of the blocks 204 & 206 must have data paths 208 routed around or under intervening blocks in order to communicate with each other or with a third block 202. Conventional very-large-scale-integration (VLSI) designs typically present significant blockages due to large hard IP blocks aboard the chips. For large processors, much of the on-chip signaling must go around a large central cortex, resulting in high traffic density detouring around the larger blocks. In many floorplans, the shortest route between two blocks may be the long way around an intervening block. These relatively long distances may also introduce the need for repetitious instances of components, such as additional buffers, inverters, voltage regulators, repeaters, drivers, and so forth, not to mention the extra routing itself as circuit components become more removed from each other due to the floorplan's layout.

The example microelectronics package 106 has functional blocks 110 & 204 & 206 coupled to the active base die 108 as chiplets, via the native interconnects 210 of the chiplets 110 & 204 & 206. The active base die 108 has incorporated functional block 202 into the active base die 108 as a purposeful part of the design. The example active base die 108 can be designed to place relevant functional blocks 202 near the native interconnects 210 of the chiplets 110 they are to connect with. This results in direct routing between components 110 & 202 over very short data paths that have a length comparable to the dimensions of the native interconnects 210 of the chiplets themselves, on the order of microns.

Figure 3:
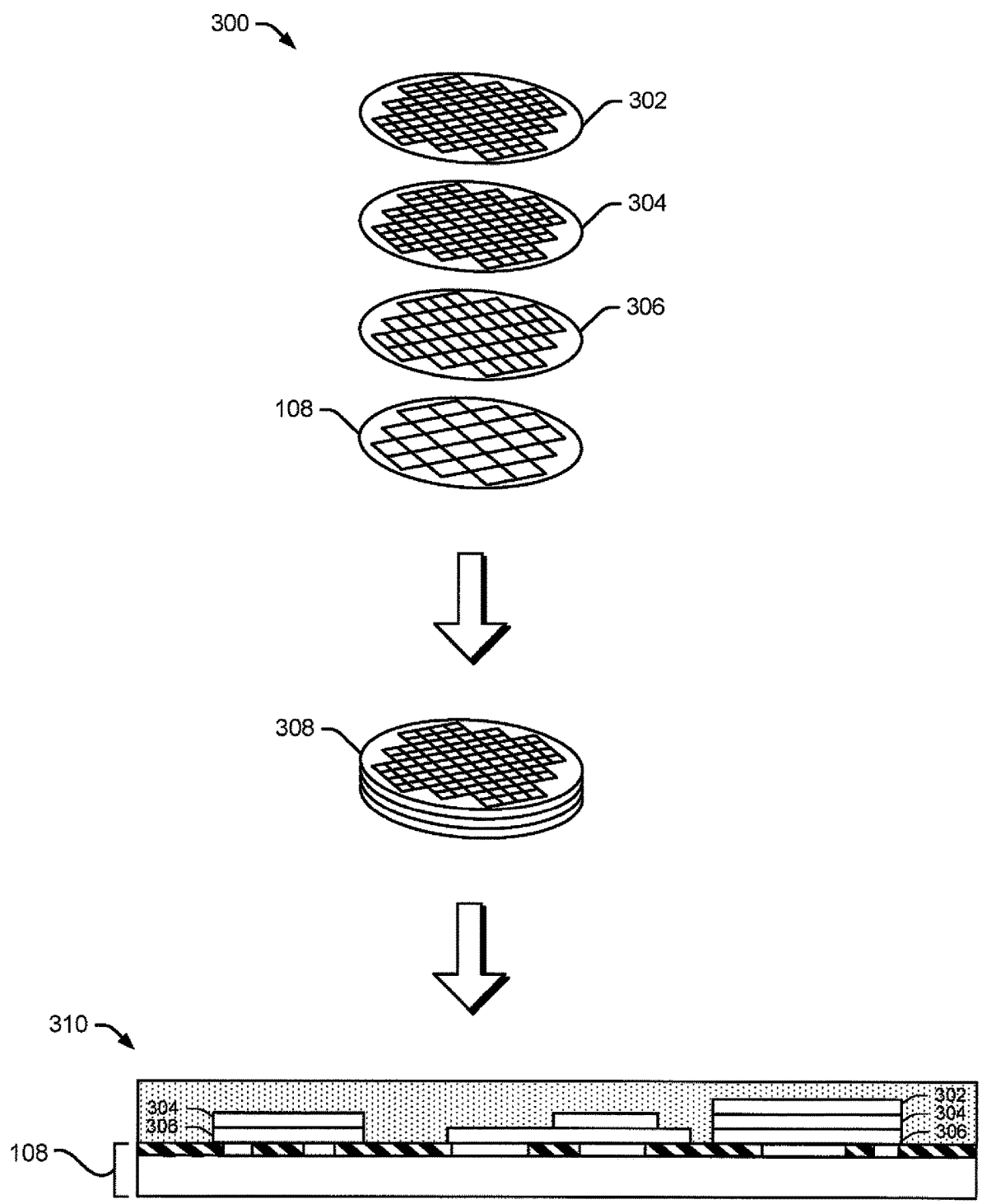
FIG. 3 is a diagram showing example wafer-to-wafer (W2 W) fabrication of direct-bonds between the native conductors of dies on a first wafer and conductors of active base dies on a second wafer to make native interfaces via a W2 W bonding process.

FIG. 3 is a diagram showing example wafer-to-wafer (W2 W) fabrication of direct-bonds between the native conductors of dies on a first wafer and conductors of an active base die on a second wafer to make native interconnects via a W2 W bonding process, such as is known as hybrid bonding or DBI. The native conductors may be provided on, at, or under a surface defined by an insulation material that may separate one or more native conductors from other conductive features including other native conductors. The insulation material may be polished to form an interface for bonding and electrical interconnect. The insulation material of one die or wafer may advantageously form a mechanical bond when brought in contact with another die or wafer, such as one with a corresponding insulation and conductor interface. The conductors may simultaneously or subsequently be fused together, e.g., by raising the temperature sufficient to cause expansion of the conductors such that opposing conductors are pressed together to form a continuous electrical connection.

Example microelectronic devices that have the benefit of native interconnects and/or active base dies 108, such as some of the devices shown below (in FIG. 4), can be fabricated from two or more semiconductor wafers 302 & 304 & 306 & 108, which are aligned, bonded into a stack 308, and diced into 3D ICs containing native interconnects and/or active base dies 108. In an implementation, each wafer may be thinned before or after bonding to enhance signal transmission through and between layers. The bottom wafer 108 may have active base dies 108, while the upper wafers 302 & 304 & 306 may have other active dies to be direct-bonded to the active base die 108 and to each other via direct-bonded native interconnects. Dicing produces instances of an example microelectronic device 310. The base die and or wafers may in some instances be implemented in a semiconductor, oxide, glass or other material. Implementations of active devices formed in semiconductor material will generally be used herein for convenience and simplicity of discussion.

Vertical connections between the layers 302 & 304 & 306 & 108 resulting in native interconnects are imparted by a direct-bonding process such as DBI, but other conventional vertical connections may also be built into the wafers before bonding or else created in the stack 310 after bonding. Through semiconductor vias (TSVs herein), for example, may optionally pass through the silicon or other semiconductor substrate(s) between active layers and/or between an active layer and an external bond pad. In general, TSVs, TOVs (through-oxide-vias), or TGVs (through-glass-vias) may interconnect through the wafer material or other material of the example active base die 108, to connect one side to the other, for example.

In an implementation, the direct-bonding process may be performed on heterogeneous wafers, since the creation of native interconnects is not stopped by heterogeneous integration. Signal propagation speed and power-density outlook is also greatly aided by the directly-bonded native interconnects and the absence of standard interfaces where the native interconnects are used. Conventionally, up to one-third of the power used by a given die is due to its wiring, the native interconnects greatly reduce the length of conductors in a circuit, thereby greatly reducing power requirements for a given die.

The native interconnects allow the native signal to be passed offboard respective dies while keeping power consumption levels as if the native signal had been kept on-chip. The shorter "wires" or conduction path of the native interconnects also reduce power consumption by generating less parasitic capacitance. Reducing the overall power consumption also yields less generation of heat, extended battery life, for example, and overall lower cost of operation.

Figure 4:
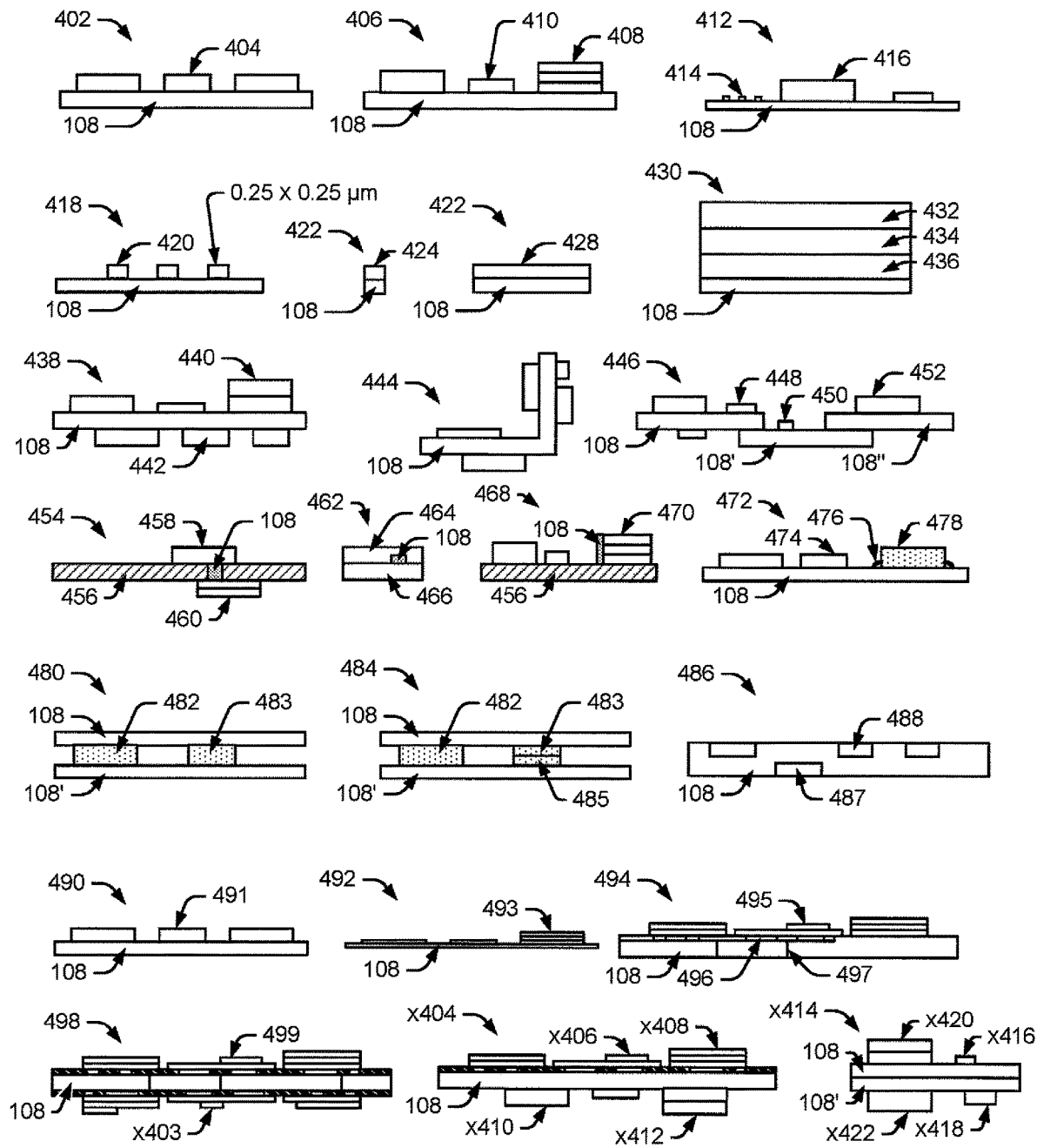
FIG. 4 provides diagrams showing various example configurations of microelectronic devices incorporating native interconnects and an active base die.

FIG. 4 shows various example configurations of microelectronic devices incorporating an active base die 108. Some example configurations show results of die-to-die or die-to-wafer direct-bonding that creates native interconnects between a first die, such as a chiplet 206, and a second die, such as the active base die 108. Other configurations show native interconnects fabricated by direct-bonding through wafer-to-wafer (W2W) processes, between an active base die 108 and the IP core logic of other active dies. The configurations shown in FIG. 4 are examples of direct-bonded native interconnects and active base dies. The shown examples are not meant to provide an exhaustive set of configurations. Many other configurations are possible. Two active dies connected by their respective native conductors and/or by one or more native interconnects do not have to be in a face-to-face configuration. The two active dies, such as an active base die and another active die, such as a chiplet, may be face up or face down. Example native interconnects do not have to be between dies that are face-to-face, but the active dies can also be face-to-back, or back-to-back, for example.

Example microelectronic device 402 includes chiplets 404 direct-bonded to an example active base die 108 in a die-to-die or die-to-wafer process.

Example microelectronic device 406 includes stacked chiplets 408 and unstacked chiplets 410 of various heights direct-bonded to an example active base die 108 in a die-to-die or die-to-wafer process.

Example microelectronic device 412 includes a mix of very small chiplets 414, for example of micron size, and relatively large chiplets 416 direct-bonded to an example active base die 108 in a die-to-die or die-to-wafer process.

Example microelectronic device 418 includes very small chiplets 420 of 0.25×0.25 micron size, for example, direct-bonded to an example active base die 108 in a die-to-die or die-to-wafer process.

Example microelectronic device 422 includes a very small chiplet 424 of micron size, for example, direct-bonded to an example active base die 108 of the same size or footprint as the example chiplet 424.

Example microelectronic device 426 includes a large mega-chiplet 428 direct-bonded to an example active base die 108 of the same size or footprint as the chiplet 428. In general, there is no requirement for chiplet size, but it is often practical to have a given chiplet size a multiple or a fractional of the size of the active base die 108.

Example microelectronic device 430 includes chiplets 432 & 434 & 436 direct-bonded in a stack to an example active base die 108 of the same size or footprint as the chiplets 432 & 434 & 436. This example configuration of a microelectronic device 430 using the active base die 108 to host one or more memory controllers, for example, may be useful in fabricating or emulating various types of high bandwidth memory modules, such as DDR4 SDRAM, DDR5 SDRAM, high bandwidth memory (HBM), hybrid memory cube (HMC), and so forth.

Example microelectronic device 438 includes example chiplets 440 & 442 direct-bonded to opposing sides of an example active base die 108 that has connective conductors on both major sides.

Example microelectronic device 444 includes an example active base die 108 disposed in multiple planes with example chiplets direct-bonded to multiple sides of the example active base die 108.

Example microelectronic device 446 includes multiple example active base dies 108 & 108' & 108" bonded to each other and bonded to respective example chiplets 448 & 450 & 452.

Example microelectronic device 454 includes an example active base die 108 embedded in substrate 456. The example embedded active base die 108 has conductive contacts on opposing sides, and is smaller than the chiplets 458 and 460 direct-bonded to the example active base die 108.

Example microelectronic device 462 includes an example active base die 108 embedded in an example chiplet 464. The example chiplet 464 with embedded active base die 108 is direct-bonded to another chiplet 466 directly, and also via the embedded active base die 108.

Example microelectronic device 468 includes an example vertical active base die 108 direct-bonded to the sidewalls of chiplets in a stack of chiplets 470 bonded to a substrate 456.

Example microelectronic device 472 includes an example active base die 108 that directly bonds to chiplets 474 and also accommodates conventional standard interfaces 476 to connect a chiplet 478.

Example microelectronic device 480 includes example chiplets 482 & 483 with native interconnects on both opposing sides of the chiplets 482 & 483 to direct-bond to multiple active base dies 108 & 108'.

Example microelectronic device 484 includes example chiplets 482 & 483 & 485 with native interconnects on both opposing sides of the chiplets 482 & 483 & 485 to direct-bond to multiple active base dies 108 & 108' and form stacks of chiplets 483 & 485 between the multiple active base dies 108 & 108'.

Example microelectronic device 486 includes example chiplets 487 & 488 embedded in an example active base die 108.

Example microelectronic device 490 includes example active dies 491 direct-bonded to an active base die 108 in a wafer-to-wafer (W2W) fabrication.

Example microelectronic device 492 includes example active dies 493 direct-bonded singly and in stacks to an active base die 108 in a wafer-to-wafer (W2W) fabrication, after thinning of respective wafers to make a thin microelectronic device 492. The thinned wafers, for example down to 3 μm, provide a much easier and more efficient route for signals to traverse after direct-bonding, in addition to the size reduction provided by the thinned wafers.

Example microelectronic device 494 includes example active dies 495 direct-bonded singly and in stacks to an active base die 108 in a wafer-to-wafer (W2W) fabrication. The microelectronic device 494 also includes redistribution layer (RDL) feature 496 and one or more through silicon vias (TSVs) 497.

Example microelectronic device 498 includes an example two-sided active base die 108 with active components and respective conductors on both sides of the active base die 108, and with active dies 499 & x403 built-up on both sides of the two-sided active base die 108 in a wafer-to-wafer (W2W) fabrication.

Example microelectronic device x404 includes example active dies x406 & x408 direct-bonded to one side of an active base die 108 in a wafer-to-wafer (W2W) fabrication, with chiplets x410 & x412 direct-bonded to an opposing side of the active base die 108.

Example microelectronic device x414 includes back-to-back or stacked active base dies 108 & 108', with active components of the back-to-back active base dies 108 & 108' bonded and/or direct-bonded to each respective active base die 108 or 108'. The available sides of the back-to-back active base dies 108 & 108' may have direct-bonds to the native interconnects of respective chiplets x416 & x418 and stacks of chiplets x420 & x422, or may be direct-bonded to other active dies via a wafer-to-wafer (W2W) fabrication.

Figure 5:
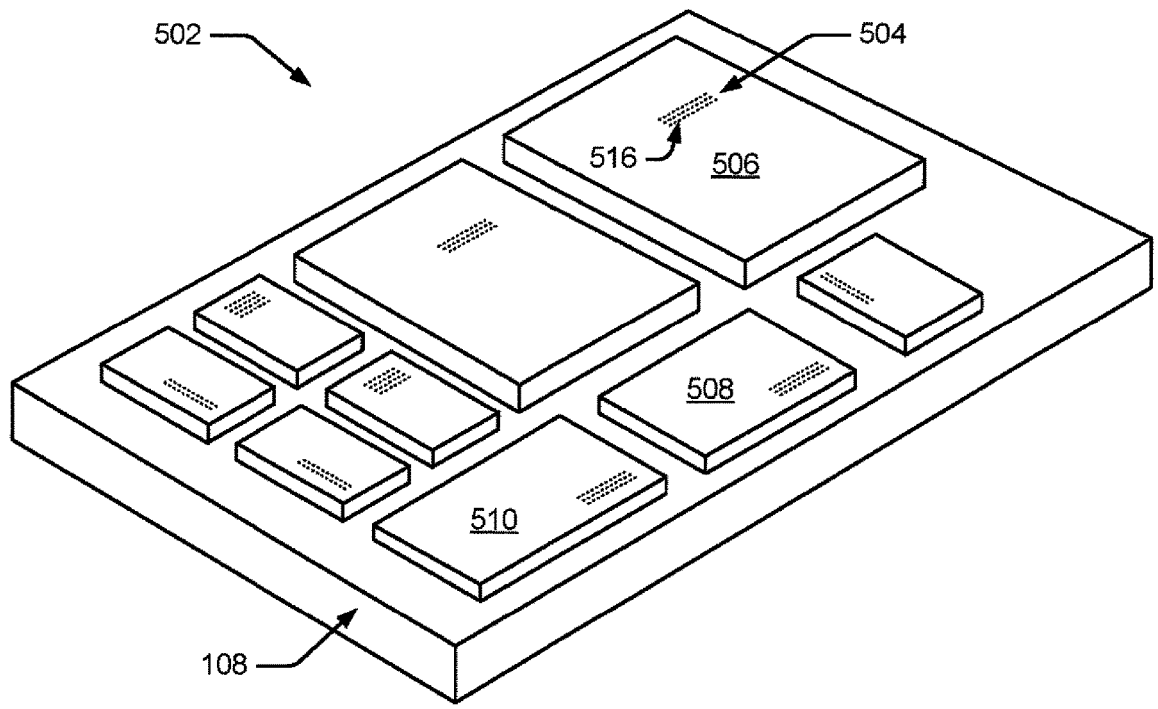
FIG. 5 is a diagram of an example active base die as included within an example microelectronic device.
Figure 5:
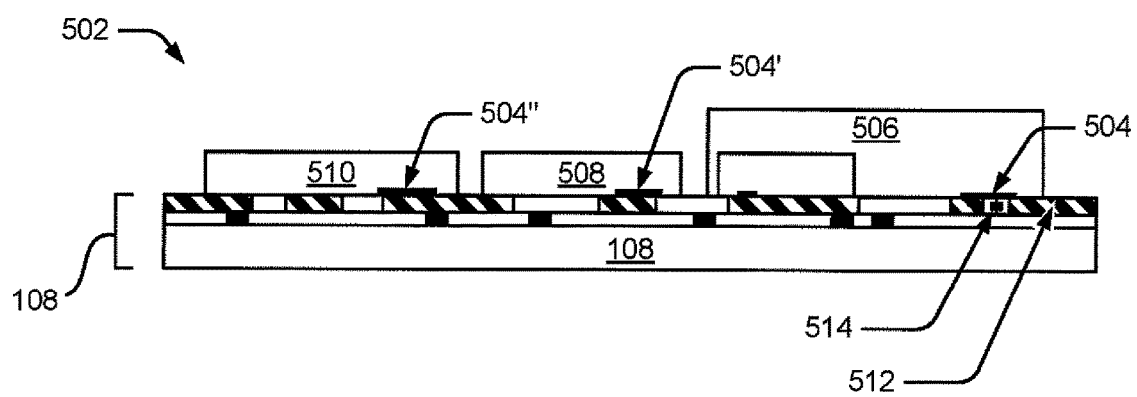

FIG. 5 shows an example active base die 108 as included within an example microelectronic device 502, such as an integrated circuit package 502. In an implementation, the native conductors 504 of dies, such as example chiplets 506 & 508 & 510 . . . n, connect directly to the active base die 108 instead of connecting to conventional components, such as industry standard interfaces 112, conventional interconnect layers, or passive interposers that conventionally connect chiplets and dies into a package. The native conductors 504 can be the native interconnects, contacts, wires, lines, or pads that are in core-side electrical contact with the IP core, and thus communicatively coupled with the native signals of a given chiplet 506. Some native conductors 504 of a chiplet 506 may be made accessible by the manufacturer, that is, the chiplet 506 may be manufactured especially for the given active base die 108. This connection between the native conductors 504 of a chiplet 506 and the active base die 108 can replace and eliminate the need for industry standard interfaces 112 in the microelectronic device 502, thereby providing a plethora of benefits.

By utilizing chiplets 506 with their native interconnects (504) connected directly to the active base die 108, an example system, such as a microprocessor system, can be split among a plurality of configurable components. For example, certain functions, particularly more customized or confidential portions of the system, may be provided through circuitry and blocks on the active base die 108. Certain other functions, such as more routine or less customized portions of the system, can be provided through circuitry and blocks on secondary dies, the chiplets 506 & 508 & 510 . . . n, particularly when the secondary dies are significantly smaller than the active base die 108. The chiplets 506 & 508 & 510 . . . n can be aligned and interfaced at one or various locations on the active base die 108 to closely interconnect with relevant portions of the active base die 108.

As an example configuration, certain memory IP cores may be aligned generally with processor cores or with execution engines to allow minimal trace lengths and maximum speed. More mundane and standardized cores, such as phase-locked loops (PLLs), memories, and so forth may be moved off of the active base die 108, thereby freeing up space on the active base die 108. This partitioning can also allow the active base die 108 and various IP core dies to be produced at different semiconductor processing nodes, and to be run at different voltages, all within the same example microelectronic device 502.

In an implementation, the active base die 108 may be formed at a first process node, such as 5 nm. The secondary dies 506 & 508 & 510 . . . n may be formed at more mature or legacy nodes, such as 250 nm. If the active base die 108 and secondary dies 506 & 508 & 510 . . . n both utilize a fine pitch interconnection technique, such as DBI® (direct bond interconnect) hybrid technology to be described below, then these can be interconnected despite the underlying chips having different process node parameters (Ziptronix, Inc., an Xperi Corporation company, San Jose, Calif.). This inter-die interconnection capability greatly simplifies the routing required, particularly compared to conventional all-in-one microprocessor dies. Utilizing multiple dies and chiplets 506 saves costs in manufacturing as the active base die 108 and the secondary dies 506 & 508 & 510 . . . n may be able to be produced at significantly lower cost than a monolithic all-in-one die 200, and with smaller size, better performance, and lower power requirements.

Example Active Base Die

In an implementation, the active base die 108 is a silicon or other semiconductor die, and may play a substrate-like role, physically supporting smaller chiplets 506 & 508 & 510 . . . n. In some implementations, the active base die 108 may be smaller than an attached chiplet. In some cases the active base die 108 may be made of a substrate material such as a polymer, with embedded semi-conductor dies, or the active base die 108 may be mainly silicon or semiconductor, with other materials present for various reasons. The active base die 108 contains active circuitry and functional blocks 512 that give a particular integrated circuit 502 its functional identity. The customization of the particular microchip system at hand is in or on the active base die 108, while the chiplets 506 are generally standard, well-established, or ubiquitous units, usually containing a proprietary IP block.

The example active base die 108 can be distinguished at the outset from conventional passive interposers, which have one or more layers of passive conductive lines generally connecting the conventional standard interfaces 112 of various dies in 2.5D assemblies, for example. The active base die 108 can connect directly to logic, with minimal drive distances, while a conventional passive die would have too many crossovers and swizzles. Despite being different from a passive interposer, in an implementation the example active base die 108 can additionally incorporate all the features of a passive interposer, together with the features of the active base die 108 as described herein.

Further distinguishing the active base die 108 from a conventional passive interposer, the active base die 108 may include one or more state elements 514 usually only found onboard single dies for conventionally connecting blocks within a conventional chip, but the active base die 108 actively uses these same state elements to connect signals from one die or chiplet 506 to another. The active base die 108 may also recruit state elements aboard one or more chiplets 506 & 508 & 510 . . . n for drive aboard the active base die 108.

The recruited state element(s) 514 may be a single state element or may be multiple state elements bundled together, such as inverters and repeaters, and also components such as buffers, drivers, redrivers, state machines, voltage regulators, timing components, and the like. However, in an implementation, these example elements may reside only on the active base die 108, not on the chiplets 506 & 508 & 510 as in conventional technologies. Thus, the active base die 108 may have its own onboard state elements 514 and other supportive components to coordinate and connect diverse dies and chiplets into a working microchip system, but depending on implementation, may also utilize the existing state elements, such as drivers, inverters, repeaters, and the like that are onboard the dies and chiplets attached to the active base die 108.

In an implementation, the active base die 108 may have a design that also replaces state machines with latches instead of flip-flops, to enhance performance and efficiency, and reduce power requirements, as described further below.

The active base die 108 uses chiplets 506 & 508 & 510 . . . n and communicatively connects them together, instead of relying on a monolithic integrated circuit design. Moreover, the length of the data path formed by the interconnection between the active base die 108 and the native conductors 504 of a given chiplet 506 may be short, for example as short as 1 um, or less. The active base die 108, thus empowered to receive native signals directly from diverse chiplets, and able to freely connect and adapt these native signals between different dies and chiplets, can thereby route the signals directly over, under, or through, large IP-blocks that would conventionally constitute major blockages in a conventional large chip or processor.

The circuitry and blocks 512 within the active base die 108 are laid out and customized to provide the particular microelectronic device 502 or system at hand and to integrate the IP-blocks of the chiplets 506 & 508 & 510 . . . n into the microelectronic device 502.

The active base die 108 can be designed to make electrical contact with the native conductors 504 of the chiplets 506 at their native placement on each chiplet in lieu of each chiplet 506 being connected to a conventional standard interface 112. The elimination of conventional standard interfaces 112 eliminates unnecessary overhead of various types. Significant overhead is eliminated because the native signals of the chiplets 506 & 508 & 510 . . . n can be passed directly and in an unadulterated state to the active base die 108 over the extremely short data paths of the native interconnects 504, usually consisting of little more than the individual conductive contact points 516 between the respective native conductors 504 & 504' & 504" of the chiplets 506 & 508 & 510 . . . n and the active base die 108. The short data paths and the elimination of hardware that would conventionally modify the native signals to be suitable for a standard interface 112 provide many benefits. Removing the standard interfaces 112 from the package 502 removes an entire hierarchy of data handling complexity, and providing the short data paths interfacing with the active base die 108 provides a domino-effect of simplifications.

The native signals of a chiplet 506, once passed to the active base die 108, may be communicatively coupled to a functional block 512 or other component formed in the active base die 108 at a location at or near the interconnection with the native conductors 504 of the given chiplet 506. Each active base die 108 can be customized to have efficient placement of circuitry and functional blocks for interface with the native conductors 504 of the attached chiplets 506 & 508 & 510 . . . n. The native signals of each chiplet 506, in turn, are efficiently routed, and modified as needed, within the active base die 108 to other functional blocks 512 within the active base die 108, and significantly, to other dies or chiplets 508 & 510 . . . n that may be in contact with the active base die 108 via their respective native conductors 504.

The active base die 108 can thus eliminate the characteristically contrived interconnect placements, pad layouts, and pitch requirements of industry standard interfaces 112. An example active base die 108 can save a great deal of unnecessary redistribution routing, since the chiplets 506 connect to the active base die 108 directly, wherever the native conductors 504 natively sit for a given chiplet, resulting in minimal drive distances.

The active base die 108 can adapt multiple interconnect types on the same active base die 108, providing more flexibility than available in the conventional industry. In providing custom architectures to enable two-way communication between functional elements of the active base die 108 and off-the-shelf chiplets 506 & 508 & 510 . . . n, the active base die 108 also leverages voltage regulation to adapt voltage differences and solve voltage leveling among disparate chiplets and components.

Use of the example active base die 108 can dramatically reduce size and area of a package 502, and lower power requirements, especially when emulating large, hard-IP chips. Example active base dies 108 can integrate repeater cells for longer routes, if needed. The example active base dies 108 can also exploit data transfer schemes to boost signal quality, improve timing, and provide native high speed interfaces.

Example Chiplet Technology

In general, chiplets are dies that may be included in a 2.5D or 3D assembly, but are not on the base of the stack. The chiplets 506 can be made in various silicon foundry (process) nodes, such as 250 nm, 180 nm . . . 28 nm, 22 nm, 5 nm, and so forth, and various flavors (HPP, HPC, HPC+, etc.), which may exhibit different voltages of operation. The voltage differences may mismatch dies, and having a conventional standard interface 112 is conventionally intended to remedy these variances in operating voltages.

Silicon IP providers invest extensive efforts to characterize and validate a certain IP for every combination of foundry node and flavor that the IP providers intend to make available in a chiplet 506. This characterization is performed over a space of varying foundry process conditions, voltages and temperatures.

Each additional IP variant is a significant financial burden and a potential loss-of-opportunity. Once the IP is characterized and validated, however, the IP provider guarantees its performance unless there are modifications made to the IP. Once a modification is made, the characterization data is no longer valid and the IP provider no longer guarantees the performance of the IP and its chiplet embodiment.

In various implementations, the chiplets 506 & 508 & 510 . . . n may have their native core-side interconnects, but may be manufactured to include no conventional standard interfaces 112. In an implementation, each chiplet 506 may have minimal circuitry in order to attenuate signals to a minimum threshold, in order to prevent damage to the circuits. A given chiplet 506 may also have a voltage regulator or a state element recruited by the active base die 108 for the overall microchip system 502.

In an implementation, an example chiplet 510 has multiple independent functions and multiple ports that may communicate with a plurality of functional elements. The example chiplet 510 may have communication paths between its independent onboard functions. In an implementation, the chiplet 510 may be a memory device with two or more independently addressable memory blocks. The active base die 108 can interface with the native signals of such an example chiplet 510 and take advantage of these features.

Example Interconnection

Conventionally, for widespread commercial utilization, conventional chiplets usually include a proven silicon IP block. These conventionally include at least one standard interface 112, and the die size and power grows to accommodate these standard interfaces 112, which are not generally optimized for the IP block. For a larger system like a processor chip, the standard interfaces 112 may need to be on all sides of the processor at or beyond the periphery of the functional processor blocks. In addition, there may need to be relatively lengthy routing from each edge of the processor core to the standard interface 112. If the processor is 3×5 mm in size, and each standard interface 112 is 2 mm long, then the routing of the 3 mm long edge conventionally needs to be reduced to the 2 mm long interface, and the routing of the 5 mm long edge conventionally needs to be routed to one or two 2 mm long standard interfaces 112, all of which has an impact on route length, congestion, and power requirements.

In an implementation, the example native interconnection using an active base die 108 directly couples with native core-side interconnects 504, which are already natively present on the chiplet 506. The native interconnection aims to use the inherent native placement of the native conductors 504 as they sit on the chiplet 506, as placed by the manufacturer. By recruiting the native interconnects of the chiplets 506 & 508 & 510 . . . n, instead of conventional standard interfaces 112, the active base die 108 aims to reproduce and improve upon various architectures, such as ASIC, ASSP, and FPGA.

Interconnection between the active base die 108 and the native conductors 504 of the chiplets 506 & 508 & 510 or other active dies may be made by various different techniques. The signal pitch within a given die may be in the 0.1-5.0 micron pitch range. The native conductors 504 may be at a pitch of approximately 3 um (microns), so the bonding technology must be able to target small pad surfaces and place the conductors to be joined in sufficient alignment with each other to meet minimum overlap requirements for electrical conduction. Various techniques for fine pitch bonding may be used, such as copper diffusion bonding in which two copper conductors at fine pitch are pressed against each other while a metal diffusion bond occurs, often under pressure and raised temperature. An amalgam such as solder may be used where the pitch allows. Copper nanoparticle technology and hybrid interconnect techniques may also be used for the interconnection. Wire can be used in some circumstances. Another example interconnect technique may be used in some circumstances, as described in U.S. patent application Ser. No. 15/257,427, filed Sep. 6, 2016 and entitled, "3D-Joining of Microelectronic Components with Conductively Self-Adjusting Anisotropic Matrix," incorporated by reference herein in its entirety, in which an anisotropic matrix of conductive nanotubes or wires automatically self-adjusts to make a connection between conductors that may not be perfectly aligned with each other on two surfaces, and makes no connection where there is no overlap between conductors on the surfaces being joined.

In an implementation, DBI® (direct bond interconnect) hybrid bonding technology is applied. DBI bonding is currently available for fine-pitch bonding in 3D and 2.5D integrated circuit assembly, and can be applied to bond the native conductors 504 of the chiplets 506 & 508 & 510 . . . n to the active base die 108 (Ziptronix, Inc., an Xperi Corporation company, San Jose, Calif.). See for example, U.S. Pat. No. 7,485,968, which is incorporated by reference herein in its entirety. DBI bonding technology has been demonstrated at an interconnect pitch of 2 um. DBI bonding technology has also been demonstrated down to a 1.6 um pitch in wafer-to-wafer approaches that do not have this individual die pitch limitation with the pick-and-place (P&P) operation (Pick & Place surface-mount technology machines). With DBI technology, under bump metalization (UBM), underfill, and micro-bumps are replaced with a DBI metalization layer. Bonding at die level is initiated at room temperature followed by a batch anneal at low temperature ZiBond® direct bonding may also be used in some circumstances ((Ziptronix, Inc., an Xperi Corporation company, San Jose, Calif.).

Figure 6:
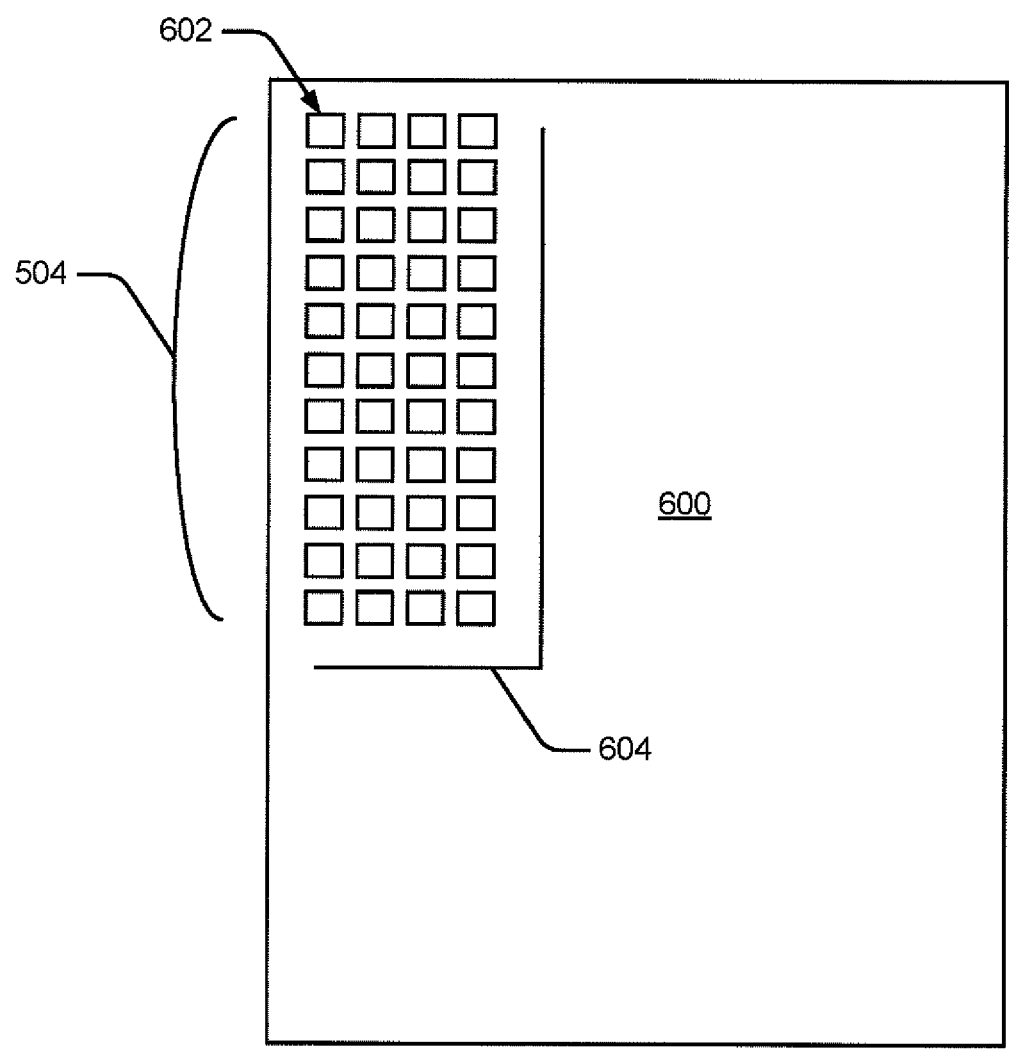
FIG. 6 is a diagram of an example core IP cell of an example chiplet.
Figure 6:
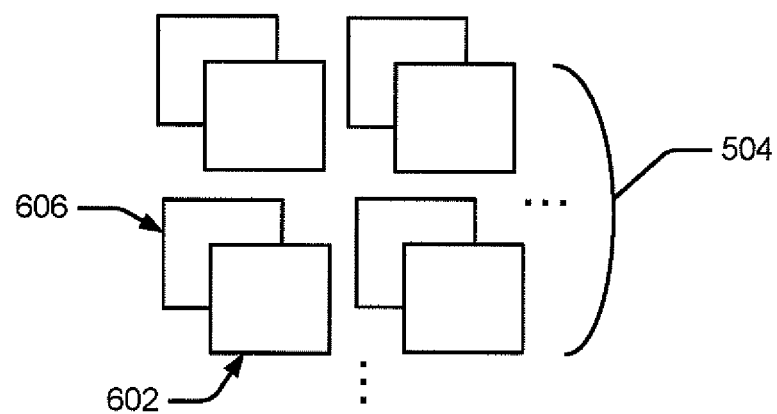

FIG. 6 shows an example core IP cell 600 of the example chiplet 506. Native core-side interconnect pads 602 in an array 604 (not shown to scale) provide the native conductors 504 to be bonded to a complement of bonding pads 606 on the active base die 108. The DBI bonds or interconnections to be made across the interface that has the native conductors 504 on one side and the complementary pads 606 or contacts of the active base die 108 on the other, are scalable and limited only by the accuracy of the chiplet placement at a pick-and-place (P&P) phase of an example operation. For example, if the P&P can handle a 1 um placement accuracy, and the pad overlap requirement is 50%, that is, 50% of each pad 602 must overlap a complementary pad 606 in both the x & y axes, then with 2×2 um pads 602 the minimum pad pitch should be greater than 3 um for these or other native conductors 504. This allows 25% or one-quarter of the pads 602 to overlap the complementary pads 606 if both x & y axes are shifted (misaligned) by the maximum allowed 50% per axis.

This fine pitch bonding of interconnects 602 available with DBI bonding and other techniques enables interconnection between pads 606 or contacts of the active base die 108 and the native conductors 504 (core-side interconnect pads 602) of the chiplet 506 with minimal or no changes to the silicon-proven IP and the native pitch, placement, and geometric pad configurations of the chiplet's core IP cell 600. Most core-side interconnects are currently at a 3 um pitch, and DBI bonding can be performed in an array 604. In an implementation, a larger pitch may be used in a small array 604, such as four rows of pads 602 or native conductors 504 at a 12 um pitch. This means that the conductive routes to this array 604 would be at least an order of magnitude shorter than the routes needed to connect to a conventional standard interface 112. The native interconnects 602 are at a fine enough pitch that they can be present in sufficient number to eliminate the conventional serializing of the output to suit the limited pin count of a standard interface 112. This also eliminates the burdens of latency and having to power the conventional serialization, since there is no need for buffers or an entire artificial interface construct.

Voltage Adaptation in the Active Base Die

Figure 7:
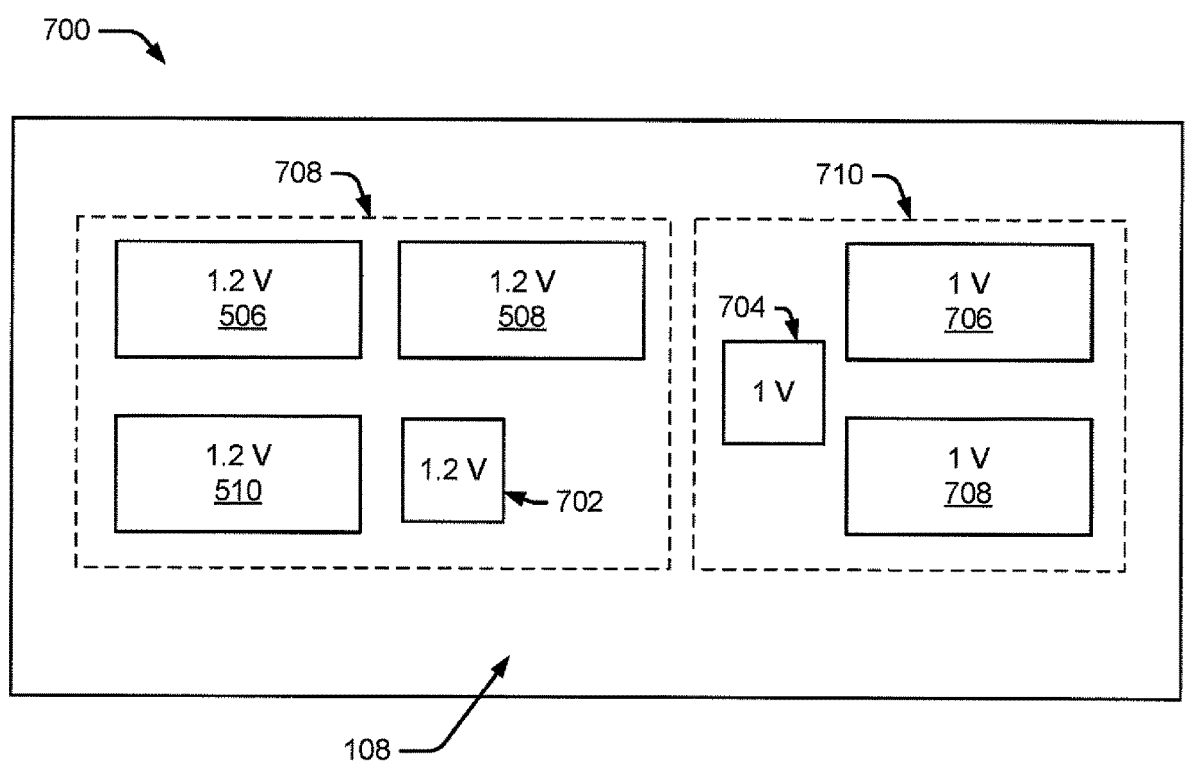
FIG. 7 is a diagram of an example active base die with voltage regulated domains.

The active base die 108 can provide voltage adaptability for coupling with diverse chiplets 506 & 508 & 510 . . . n that may have operating voltages at variance with one another. For example, a half-node 28 nm chiplet may operate in a voltage range of 0.9-1.1 volts, while a 5 nm chiplet may operate at 0.6-0.85 volts, with no voltage range overlap. To adapt to these voltage differences, the active base die 108 can also provide improved voltage control over conventional voltage leveling measures, by enabling a larger number of independent power domains that can each be managed independently in the active base die 108. For example, this can allow a CPU core to run at elevated voltage and frequency to satisfy a heavy computational load, while other cores also present execute lower priority code at a much lower voltage and frequency, to save power. Adding one or more stages of voltage conversion can also improve the power efficiency. The active base die 108 can provide such adaptive voltage leveling in multiple ways. FIG. 7 shows an example microelectronics package 700 with active base die 108 and voltage regulators 702 & 704. In an implementation, the active base die 108 has a compact voltage regulator dedicated for each set ("chipset") of the chiplets 506 & 508 & 510 . . . n, resulting in a respective voltage domain 710 for that chipset. That is, different chipsets each share a dedicated voltage regulator 702 or 704 integrated in the active base die 108. Voltage regulator 702 provides a potential of 1.2 volts to the chipset that includes chiplets 506 & 508 & 510 in domain 710. Voltage regulator 704 provides a potential of 1.0 volts to the chipset that includes chiplets 706 & 708, in domain 712. In an implementation, these voltage regulators 702 & 704 may be passive.

Figure 8:
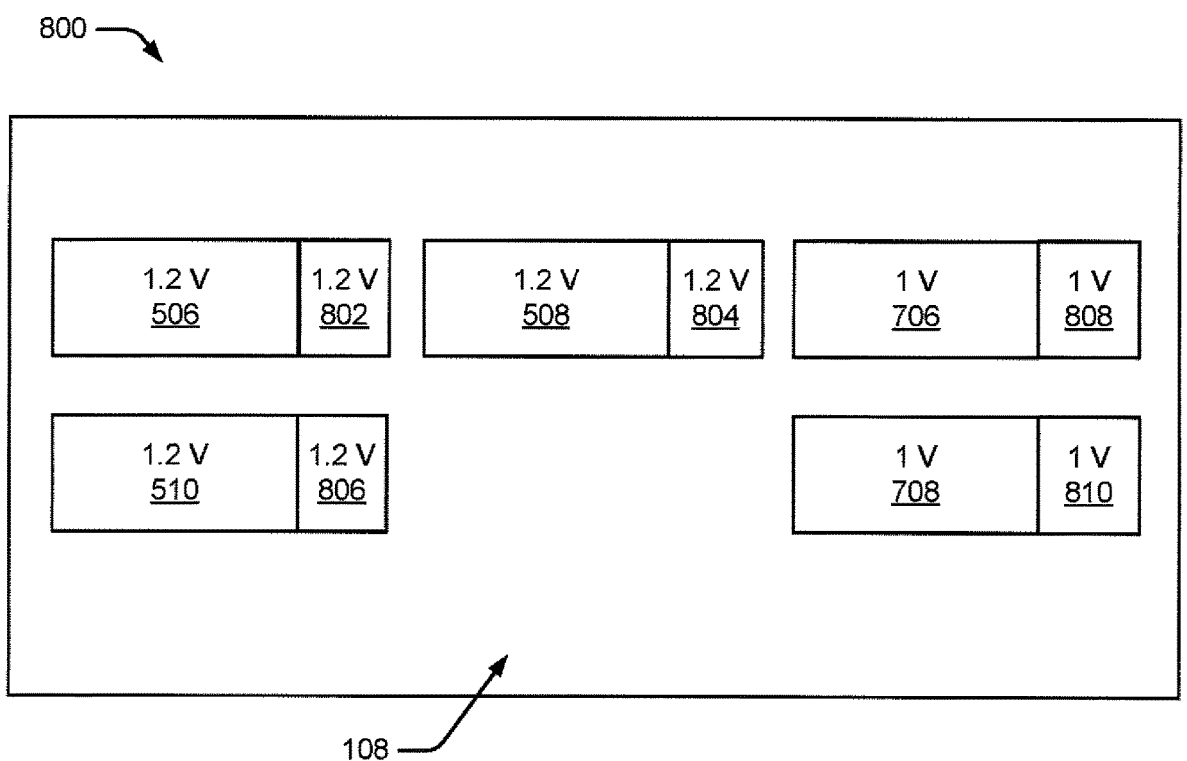
FIG. 8 is a diagram of an example active base die with one-on-one voltage regulators.

FIG. 8 shows an example microelectronics package 800 with active base die 108 and multiple voltage regulators 802 & 804 & 806 and 808 & 810. In this implementation, a single voltage regulator is placed in the active base die 108 near the I/O interface of each chiplet 506 & 508 & 510, and 706 & 708. This one-per-die scheme ensures that each chiplet 506 & 508 & 510 & 706 & 708 has its needed voltage level, and the scheme can improve power integrity. Since the voltage regulators 802 & 804 & 806 & 808 & 810 are closer to their respective dies, there are less parasitics and thus fewer IR drops and droops.

In another implementation, the active base die 108 has the voltage control capability to overdrive or underdrive the chiplets 506 & 508 & 510 & 706 & 708. The overdrive or underdrive achieves an adequate voltage overlap for voltage leveling, or enables better operation between die that have different operational voltages.

Thus, the example active base die 108 can accommodate chiplets 506 & 508 & 510 at the various different operating voltages of diverse semiconductor manufacturing technologies, either by providing one-on-one voltage regulators for various chiplets, or by having different voltage domains for sets of chiplets aboard the active base die 108.

Timing and Priority

Figure 9:
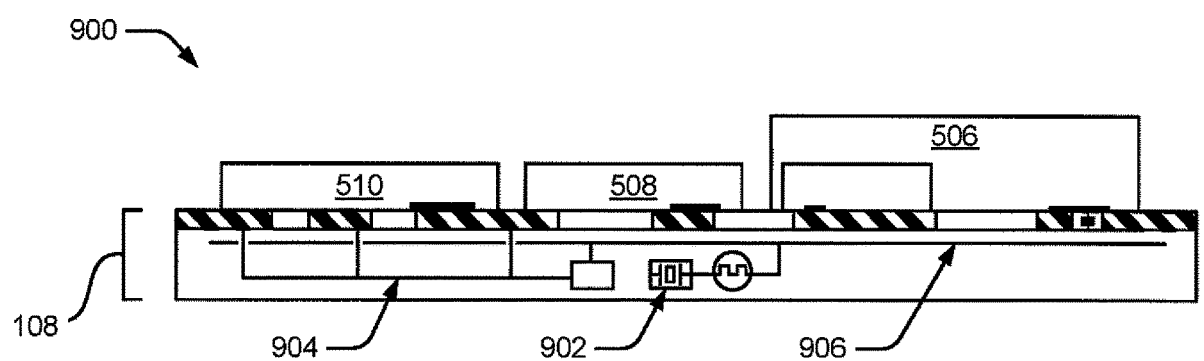
FIG. 9 is a diagram of an example active base die including a clock for timing and synchronizing process steps and data transfers.

FIG. 9 shows an example microelectronics package 900 with active base die 108 including a clock 902 for timing and synchronizing process steps and data transfers. The example active base die 108 can provide a global or regional clock signal in the active base die 108, which can also be used for timing and synchronization interactions with the chiplets 506. The clock signaling is enhanced to synchronize data transfers that take advantage of the short data paths of the native interconnects with chiplets 506 & 508 & 510 . . . n, and minimal routing blockages, thereby boosting performance. The active base die 108 may have a clock 902 internal or external to itself, depending on implementation, and in various implementations may include various communication channeling schemes, onboard communication network 904 or a bus 906 or buses, for example.

Figure 10:
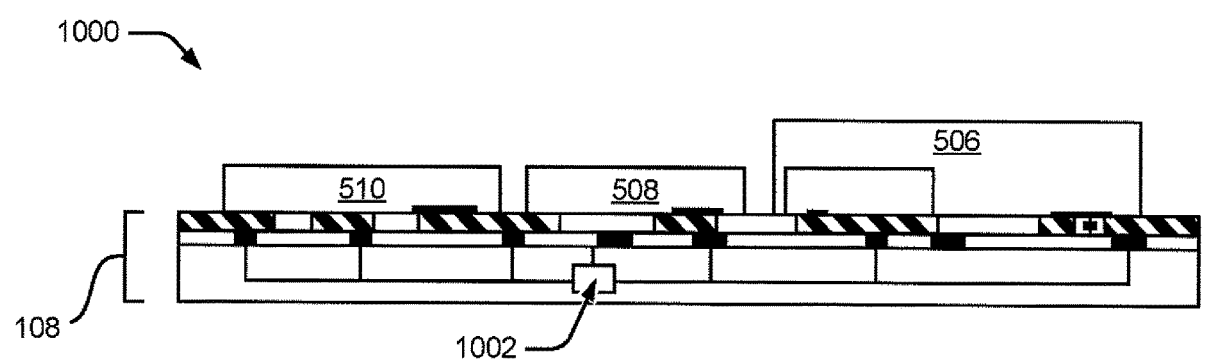
FIG. 10 is a diagram of an example active base die with a negotiation engine or an out-of-order engine.

FIG. 10 shows an example microelectronics package 1000 with active base die 108 and an example negotiation engine 1002 or out-of-order engine. The example active base die 108 and negotiation engine 1002 can boost performance by determining which of the functional blocks in the active base die 108 has current priority for one-way or two-way communication with the chiplets 506 & 508 & 510 . . . n. The active base die 108 may also determine priorities among execution engines and functional blocks for given instructions, both in the active base die 108 and with respect to the chiplets 506 & 508 & 510 . . . n. In communicating and prioritizing, the active base die 108 has an advantage that large IP blocks reside in the chiplets 506, thereby alleviating many routing blockages. This can enable data traffic to move from the spine of a layout, improving timing. Soft logic can also be improved over a larger area, eliminating mitigating circuitry that is conventionally used to re-time and redrive signaling.

During RTL design, logic synthesis as applied to the design of the active base die 108 may place repeater cells where necessary for longer data routes. Flop state machines can be replaced with latches where applicable to increase efficiency further. A synthesis tool, such as a timing closure tool may be used to insert repeaters and redrivers for the longer channel lengths, as needed during design. The synthesis tool may also simulate the microchip system 502, perform retiming and level shifting, and may insert inverting nodes to the design to close the timing path.

The active base die 108 generally has fewer repeaters than a comparable conventional layout, because blockages are reduced by moving large IP blocks to the chiplets 506. Also, there is shorter path delay because of the direct and very short interconnects between the native interconnects 504 of the chiplets 506 and the active base die 108. Alternatively, the chiplet timing may be closed to the state drivers and the electronic design automation applied at a hierarchical level.

In an implementation, the active base die 108 achieves a performance increase by adopting a dual data rate (DDR) data transfer protocol, transferring data on rising and falling edges of the onboard clock signal. In another implementation, the active base die 108 may use a quad data rate (QDR) performing four data transfers per clock cycle.

The active base die 108 may also utilize other means for speeding up performance, such as the negotiation engine 1002 or an out-of order engine to stage data and instructions between execution engines.

Neural Network Embodiment

Figure 11:
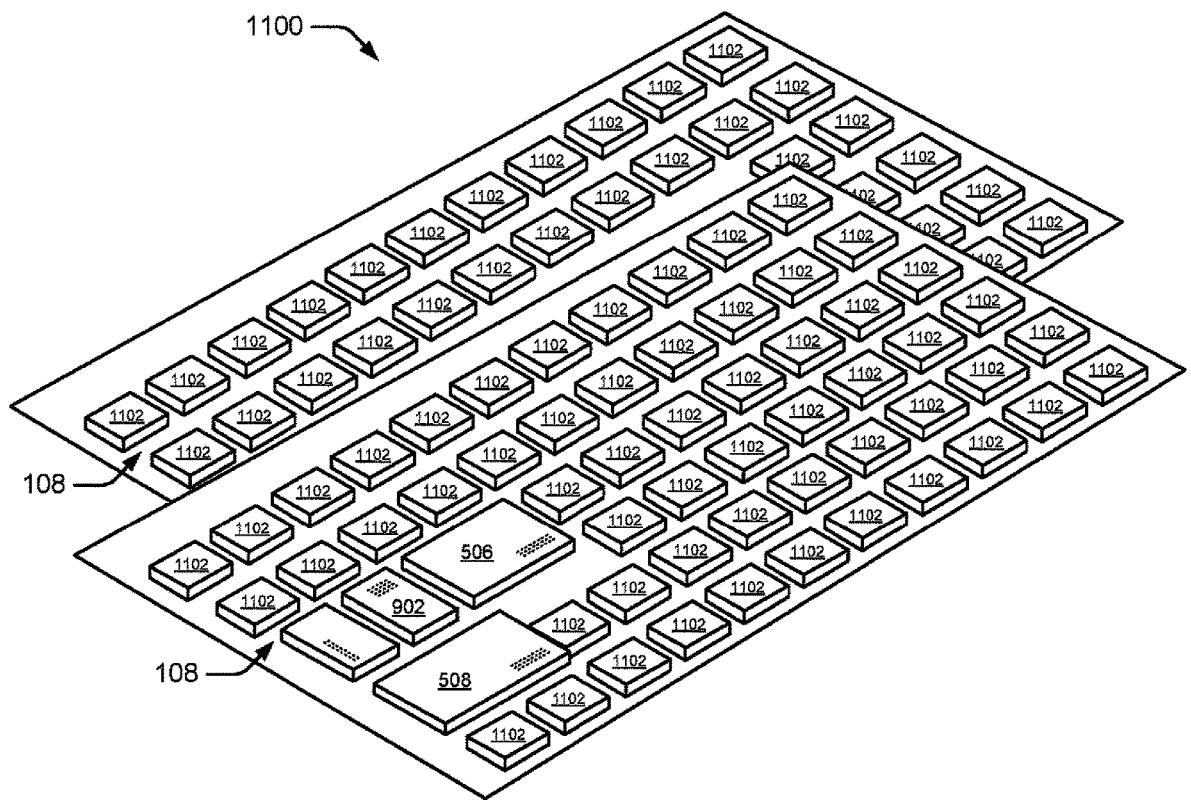
FIG. 11 is a diagram of an example neural network embodiment using an example active base die.

FIG. 11 shows an example neural network embodiment of a microelectronic device 1100 using an example active base die 108. Conventionally, architecture for configuring a neural network might include many large conventional general purpose processors, with the cores of the conventional hardware recruited by programming to set up a neural network paradigm.

To set up a 3D volume of neurons or a convolutional neural network for image analysis, machine vision, computer vision, or various forms of artificial intelligence, however, the recruitment and layout of conventional large processors becomes cumbersome and eventually fails the task, or provides an inefficient solution, since large processors are not really optimized for the nuances and larger neuronal layouts of evolving neural network architecture.

The active base die 108 in FIG. 11 provides the ideal medium for growing larger and more sophisticated neural network topologies. First, the active base die 108 can be scaled to large sizes and can contain favorably repetitious instances of the support elements needed for a given neural network architecture. Next, the large monolithic conventional processors of conventional network design can be replaced by one or more large fields of repeatable and very small processing elements, each processing element represented in a chiplet 1102 coupled to the active base die 108 for very efficient and burden-free handling of the native signals from each of these processing elements 1102. The active base die 108 may also include a global synchronization clock 902 to coordinate timing across the field of numerous chiplets 1102 providing the processing elements. The clock 902 can make the active base die 108 scalable for very large neural network configurations.

The physical architecture of the active base die 108 with fields of attached processing element chiplets 1102 can represent neurons and synapses of neural networks and biological brain system models better than conventionally imposing a neural network paradigm on general purpose CPU chips, which are not up to the task of representing evolving neuronal architectures, and ultimately may not have the transistor count necessary to represent biological neural networks or perform higher artificial intelligence.

Process Sharing

The example active base die 108 provides unique opportunities for shared processing between dies or chiplets 506 & 508 & 510 . . . n. The active base die 108 can be equipped with time-borrowing capability to save power, reduce latency, and reduce area footprint. In an implementation, the active base die 108 can enable an architecture in which a given functional element of the active base die 108 can communicate with multiple chiplets 506 & 508 & 510 . . . n and can negotiate the priority of a particular communication among a plurality of other functional elements. Notably, the active base die 108 can share processes and resources in the active base die 108 between chiplets of various technologies, such as chiplets manufactured under different foundry process nodes.

The active base die 108 can enable chiplets of various technologies to share one or more common memories, whereas conventionally each processor has its own dedicated coupled memory. The active base die 108 can allow external memory to be utilized as embedded memory with process sharing. In such a configuration, memory access does not need to proceed each time through a memory interface, such as the DBI bonds of the native interconnect 504 to attached chiplets 506 & 508 & 510 . . . n, but instead memory access can go straight through the active base die configuration. Moreover, repair capability is enhanced as certain processes can be configured to be redundant and be used to improve yield of the stack by having one block on a given die share the repair function with another that may have a fault within a redundant block. This capability is enhanced at least in part due to the number of interconnects available through the DBI process, the proximity of adjacent blocks on either side and across the interface, and the elimination of much of the routing that would be required in conventional arrangements.

Example Methods

Figure 12:
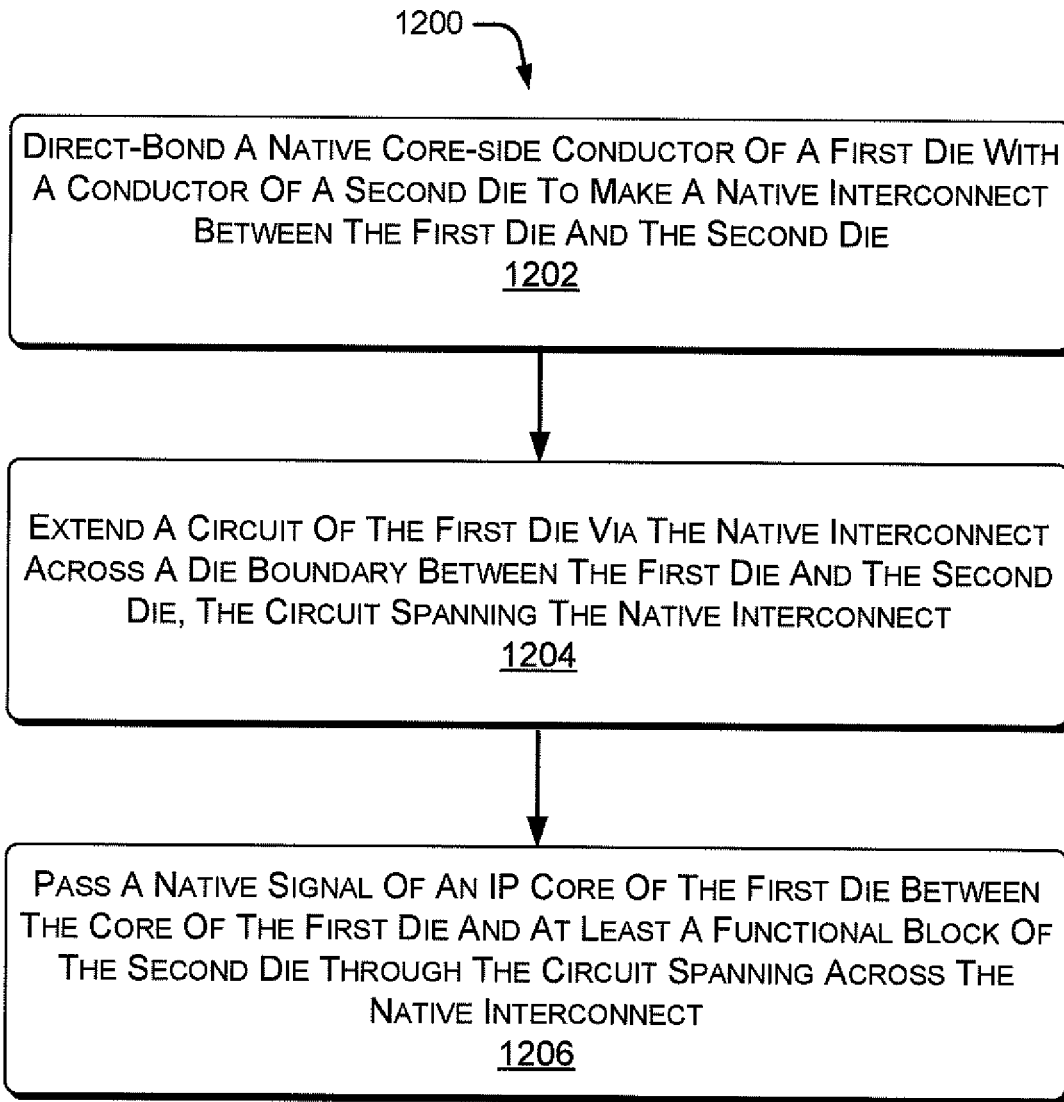
FIG. 12 is a flow diagram of an example method of fabricating a microelectronic device that includes native interconnects.

FIG. 12 shows an example method 1200 of fabricating a microelectronic device with native interconnects. Operations of the example method 1200 are shown in individual blocks.

At block 1202, a native core-side conductor of a first die is direct-bonded to a conductor of a second die to make a native interconnect between the first die and the second die.

At block 1204, a circuit of the first die is extended via the native interconnect across a die boundary between the first die and the second die, the circuit spanning the native interconnect.

At block 1206, a native signal of an IP core of the first die is passed between the core of the first die and at least a functional block of the second die through the circuit spanning across the native interconnect.

The native interconnects provided by the example method 1200 may provide an only interface between a first die and a second die, while the native interconnects forgo standard interface geometries and input/output protocols. The first die may be fabricated by a first manufacturing process node and the second die is fabricated by a different second manufacturing process node. The circuit spanning across the native interconnect forgoes interface protocols and input/output protocols between the first die and the second die when passing the native signal across the native interconnect.

The example method 1200 may further include direct-bonding native core-side conductors of multiple dies across multiple die boundaries of the multiple dies to make multiple native interconnects, and spanning the circuit across the multiple die boundaries through the multiple native interconnects. The multiple native interconnects providing interfaces between the multiple dies, and the interfaces forgo interface protocols and input/output protocols between the multiple dies.

The example method 1200 may pass the native signal between a functional block of the first die and one or more functional blocks of one or more other dies of the multiple dies through one or more of the native interconnects while forgoing the interface protocols and input/output protocols between the multiple dies. The native signal may be passed unmodified between the core of the first die and the at least one functional block of the second die through the circuit spanning across the native interconnect.

The native signal may be level shifted between the core of the first die and the at least one functional block of the second die through the circuit spanning across the native interconnect, the level shifting to accommodate a difference in operating voltages between the first die and the second die.

The example method 1200 may be implemented in a wafer-to-wafer (W2W) bonding process, for example, wherein the first die is on a first wafer and the second die is on a second wafer, and wherein the W2W bonding process comprises direct-bonding native core-side conductors of the first die with conductors of the second die to make native interconnects between the first die and the second die, the native interconnects extending one or more circuits across a die boundary between the first die and the second die, the one or more circuits spanning across the one or more native interconnects, the native interconnects providing an interface between respective dies, the interface forgoing interface protocols and input/output protocols between the respective dies. The first wafer and the second wafer are fabricated from heterogeneous foundry nodes or the first die and the second die are fabricated from incompatible manufacturing processes. In an implementation, the example method 1200 may direct-bond the native core-side conductors between some parts of the first wafer and the second wafer to make the native interconnects for passing the native signals, but create other interfaces or standard interfaces on other parts of the wafer for passing amplified signals in a microelectronic device resulting from the W2W process.

The first die or the second die may be an active base die. The first die may also be a chiplet including an IP logic core and the second die comprises an active base die. In some cases, the chiplet may range in size from 0.25×0.25 microns, for example, up to the same size as the active base die. The example method 1200 may stack the active base die and the multiple chiplets in a stack or a 3D stack IC structure having multiple layers, wherein each layer in the stack or the 3D stack IC structure is direct-bonded to make the native interconnects between the dies of the different layers.

Figure 13:
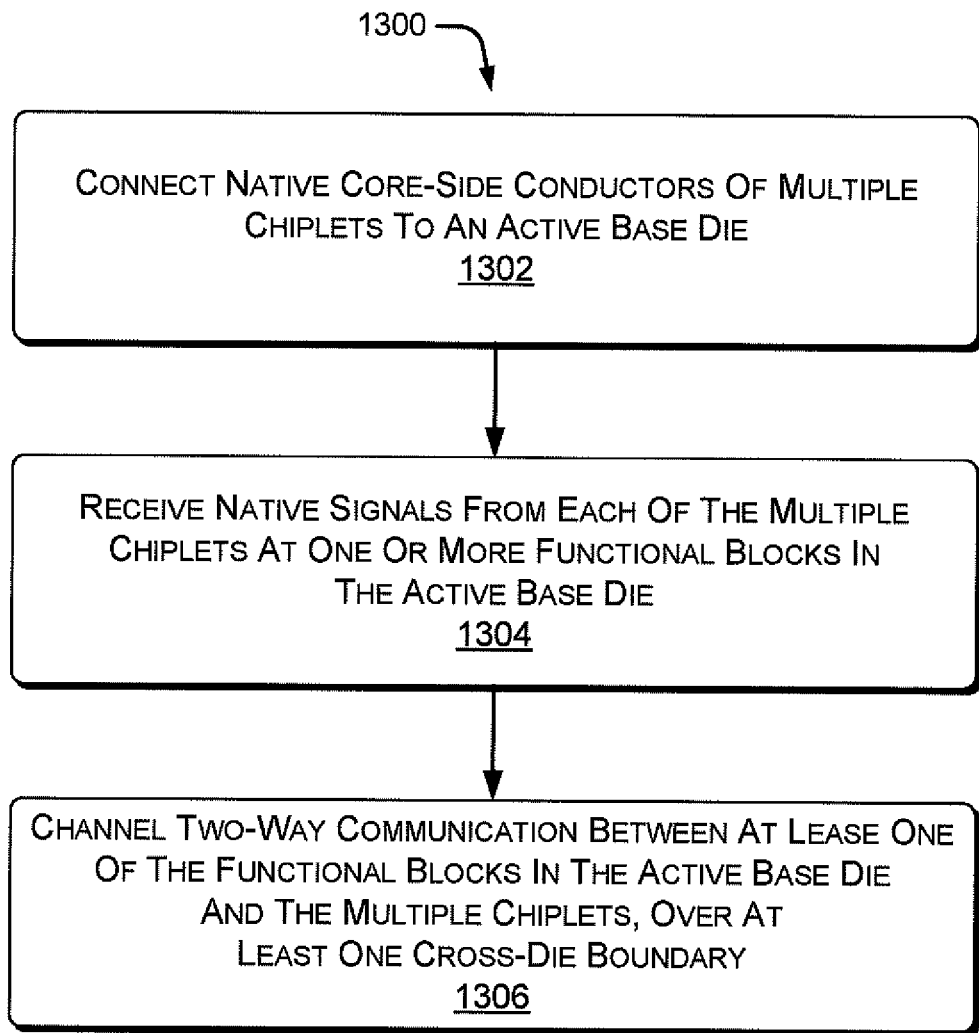
FIG. 13 is flow diagram of an example method 1300 of providing a microchip architecture for semiconductor chiplets, in which native core-side conductors of multiple chiplets are connected to an active base die.

FIG. 13 shows an example method 1300 of providing a microchip architecture for semiconductor chiplets. In the flow diagram, the operations of the method 1300 are shown as individual blocks.

At block 1302, native core-side conductors of multiple chiplets are connected to an active base die. The native interconnects coupled with the active base die avoid the need for industry standard interfaces that would conventionally be aboard the chiplets.

At block 1304, native signals from each of the multiple chiplets are received at one or more functional blocks in the active base die.

At block 1306, two-way communication is channeled between at least one of the functional blocks in the active base die and the multiple chiplets, over at least one cross-die boundary.

Figure 14:
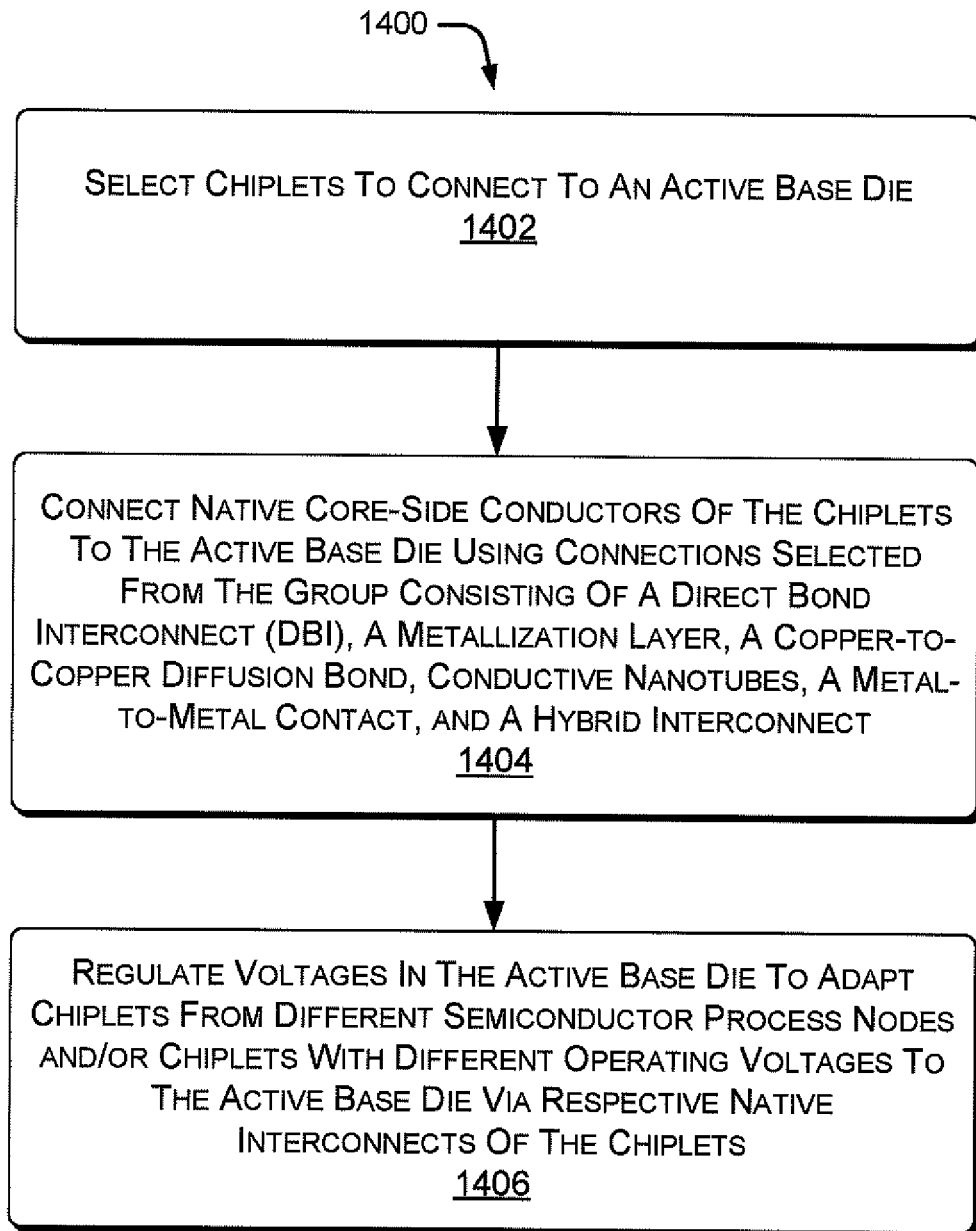
FIG. 14 is a flow diagram of an example method 1400 of providing a microchip architecture for semiconductor chiplets, in which voltages are regulated to adapt diverse chiplets.

FIG. 14 shows another example method 1400 of providing a microchip architecture for semiconductor chiplets, including voltage regulation to adapt diverse chiplets. In the flow diagram, the operations of method 1400 are shown as individual blocks.

At block 1402, chiplets are selected to connect to an active base die.

At block 1404, the native core-side conductors of the multiple chiplets are variously connected the active base die using connections selected from the group consisting of a direct bond interconnect (DBI) metallization layer, a copper-to-copper diffusion bond, a connection with conductive nanotubes, a metal-to-metal contact, and a hybrid interconnect.

At block 1406, voltages are regulated to adapt chiplets from different semiconductor process nodes and/or chiplets with different operating voltages to the active base die via respective native interconnects of the chiplets.

Figure 15:
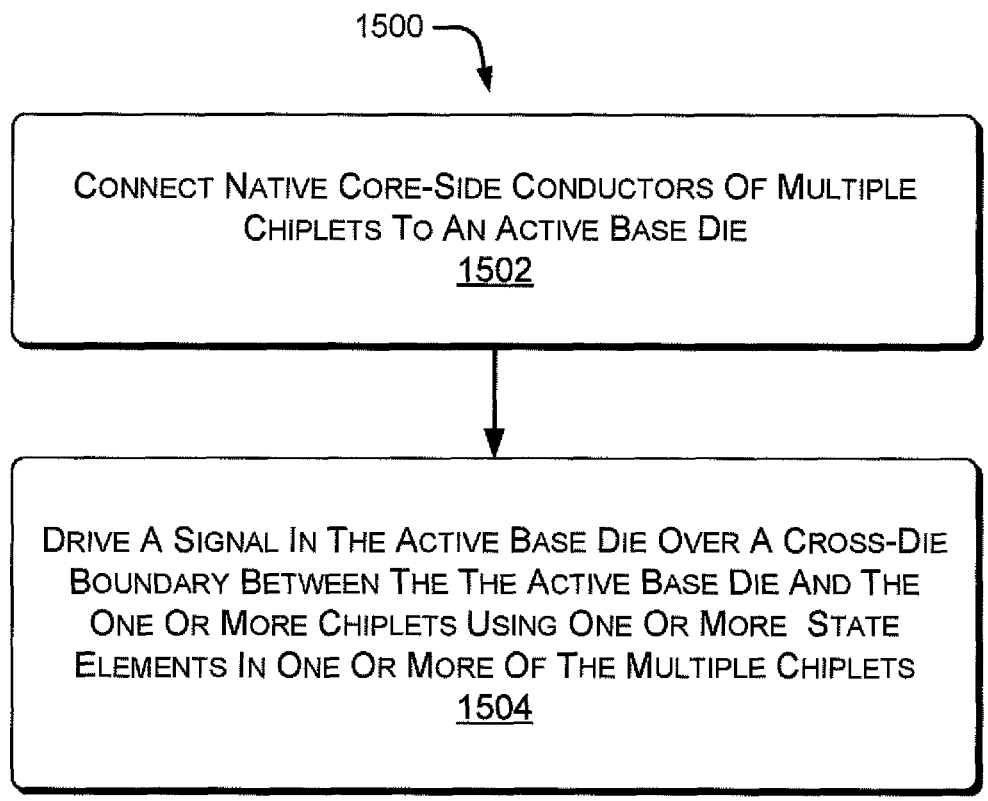
FIG. 15 is a flow diagram of an example method of providing a microchip architecture for semiconductor chiplets, using state elements in a connected chiplet for signal drive in an active base die.

FIG. 15 shows another example method 1500 of providing a microchip architecture for semiconductor chiplets, using state elements in a connected chiplet for signal drive in an active base die. In the flow diagram, the operations of method 1500 are shown as individual blocks.

At block 1502, native core-side conductors of multiple chiplets are connected to an active base die.

At block 1504, state elements of one or more of the multiple chiplets are used by the active base die for driving a signal over a cross-die boundary between the active base die and the one or more chiplets. The cross-die boundary may be only 1 um thick, or even less.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A system, comprising:
an active base die configured to receive a first signal; and
a first die comprising a first functional block and a first conductor that is direct-bonded to the active base die by a first interconnect, wherein
the first signal is received at the active base die from the first functional block through an unserialized data path, and
the unserialized data path comprises the first conductor and the first interconnect.

2. The system of claim 1, wherein the first functional block comprises a multiplier, an arithmetic logic unit (ALU), an instruction decoder, a digital signal processor (DSP), a subsystem intellectual property (IP) core, or a combination thereof.

3. The system of claim 1, wherein the first functional block comprises an intellectual property (IP) core, the IP core comprising a memory controller or a reusable unit of logic.

4. The system of claim 1, wherein the first signal is transmitted between the first die and the active base die without the use of a standard interface comprising an input/output (I/O) protocol.

5. The system of claim 1, wherein the first die comprises a plurality of first conductors direct bonded to the active base die by a plurality of first interconnects, and the plurality of first conductors have a pitch of between 0.1 µm and 5 µm at a surface of the first die.

6. The system of claim 5, wherein the plurality of first conductors are respectively direct-bonded to a corresponding plurality of bond pads disposed in a surface of the active base die.

7. The system of claim 1, wherein the first die comprises a plurality of first conductors direct bonded to the base die by a plurality of first interconnects, and the plurality of first conductors and the plurality of first interconnects form one or more continuous circuits between the first die and base die.

8. The system of claim 7, wherein the first die and the base die are in two-way communication through the one or more continuous circuits.

9. The system of claim 1, wherein the first interconnect is selected from a group consisting of a direct bond interconnect (DBI) metallization layer, a copper-to-copper diffusion bond, a connection with conductive nanotubes, a metal-to-metal contact, and a hybrid interconnect.

10. The system of claim 1, wherein the first interconnect comprises a direct bond interconnect (DBI) metallization layer.

11. The system of claim 1, wherein the active base die comprises one or more voltage regulators or voltage regulation domains for adjusting voltages between different dies bonded to the active base die.

12. The system of claim 1, wherein the first conductor comprises a repeater, a buffer, a driver, a redriver, a state machine, a voltage regulator, a timing component, or a combination thereof.

13. The system of claim 1, further comprising:
a second die comprising a second functional block and a second conductor direct-bonded to the active base die by a second interconnect, wherein the active base die is configured to receive a second signal from the second functional block through an unserialized data path comprising the second conductor and the second interconnect.

14. The system of claim 13, wherein the first conductor is directed bonded to a first side of the active base die and the second conductor is direct-bonded to an opposite second side of the active base die.

15. The system of claim 13, wherein the first die and the second die are disposed on the active base die in a stacked arrangement, and the second conductor comprises a via formed through the first die.

16. The system of claim 13, wherein the first die and the second die are disposed on the active base die in a side-by-side arrangement.

17. The system of claim 16, further comprising a third die disposed on the second die.

18. The system of claim 1, further comprising:
a second die disposed on the first die in a stacked arrangement, the second die comprising a second functional block and a second conductor direct-bonded to the first die by a second interconnect, wherein the first die is configured to receive a second signal from the second functional block through an unserialized data path comprising the second conductor and the second interconnect.

19. The system of claim 18, wherein at least one of the first or second functional blocks comprise a memory controller.

20. The system of claim 1, further comprising a plurality of micron-size second die disposed on the base die in a side-by-side arrangement with the first die, wherein each of the plurality of second die comprises a second functional block and a second conductor direct-bonded to the active base die by a second interconnect, the active base die is configured to receive second signals from the second functional blocks through unserialized data paths that each comprise a second conductor and a second interconnect.

* * * * *